United States Patent
Wei et al.

(10) Patent No.: US 12,230,182 B2
(45) Date of Patent: Feb. 18, 2025

(54) PIXEL CIRCUIT AND DRIVING METHOD THEREFOR, DISPLAY SUBSTRATE, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Xinyu Wei, Beijing (CN); Kai Zhang, Beijing (CN); Qiang Fu, Beijing (CN); Gang Wang, Beijing (CN); Erlong Song, Beijing (CN); Hongmei Fan, Beijing (CN); Kunyan Shi, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 18/273,201

(22) PCT Filed: Jul. 8, 2022

(86) PCT No.: PCT/CN2022/104654
§ 371 (c)(1),
(2) Date: Jul. 19, 2023

(87) PCT Pub. No.: WO2023/005641
PCT Pub. Date: Feb. 2, 2023

(65) Prior Publication Data
US 2024/0153428 A1    May 9, 2024

(30) Foreign Application Priority Data

Jul. 30, 2021   (WO) ............... PCT/CN2021/109894
Aug. 5, 2021    (CN) ......................... 202110897625.2

(51) Int. Cl.
*G09G 3/20*      (2006.01)
*G09G 3/3225*    (2016.01)
(Continued)

(52) U.S. Cl.
CPC ......... *G09G 3/2007* (2013.01); *G09G 3/3225* (2013.01); *G09G 3/3233* (2013.01);
(Continued)

(58) Field of Classification Search
CPC ............... G09G 3/2007; G09G 3/3233; G09G 2300/0408; G09G 2300/0819;
(Continued)

(56) References Cited

U.S. PATENT DOCUMENTS 6,501,448 B1   12/2002  Komiya et al.
11,049,458 B1   6/2021  Fan et al.
(Continued)

FOREIGN PATENT DOCUMENTS

CN        1435805 A     8/2003
CN      104485071 A     4/2015
(Continued)

OTHER PUBLICATIONS

Jul. 3, 2024—(US) Non-Final Office Action—U.S. Appl. No. 18/014,763.
(Continued)

*Primary Examiner* — Mihir K Rayan
(74) *Attorney, Agent, or Firm* — Banner & Witcoff, Ltd.

(57) ABSTRACT

A pixel circuit and a driving method therefor, a display substrate, and a display apparatus. The pixel circuit includes a driving sub circuit, a data writing sub circuit, a first light-emitting control sub circuit, a first reset sub circuit, and a bias sub circuit; the first reset sub circuit is connected to a first node and configured to write a first reset voltage to the first node in response to a first reset control signal; and the (Continued)

bias sub circuit is connected to a second node and configured to write a reference voltage to the second node in response to a bias control signal, thereby turning on the driving sub circuit.

18 Claims, 16 Drawing Sheets

(51) Int. Cl.
    *G09G 3/3233*     (2016.01)
    *G09G 3/3258*     (2016.01)
    *H10K 59/131*     (2023.01)

(52) U.S. Cl.
    CPC .......... *G09G 3/3258* (2013.01); *H10K 59/131* (2023.02); *G09G 2300/0408* (2013.01); *G09G 2300/0426* (2013.01); *G09G 2300/0819* (2013.01); *G09G 2300/0842* (2013.01); *G09G 2300/0852* (2013.01); *G09G 2300/0861* (2013.01); *G09G 2310/0254* (2013.01); *G09G 2310/061* (2013.01); *G09G 2310/08* (2013.01); *G09G 2320/0233* (2013.01); *G09G 2320/0247* (2013.01); *G09G 2320/0252* (2013.01); *G09G 2320/0257* (2013.01); *G09G 2320/045* (2013.01); *G09G 2320/0626* (2013.01)

(58) Field of Classification Search
    CPC ....... G09G 2300/0852; G09G 2310/08; G09G 2320/0247; G09G 2320/0252; G09G 2320/0257; G09G 2320/0626; G09G 3/2074; G09G 3/32; G09G 3/3208; G09G 3/3225; G09G 3/3258; G09G 2300/0426; G09G 2300/0842; G09G 2300/0861; G09G 2310/0251; G09G 2310/0254; G09G 2310/0262; G09G 2310/061; G09G 2320/0233; G09G 2320/0258; G09G 2320/045; H10K 59/131
    See application file for complete search history.

(56) References Cited

U.S. PATENT DOCUMENTS

| | | | |
|---|---|---|---|
| 11,217,175 B2* | 1/2022 | Teng | G09G 3/3225 |
| 2002/0089291 A1* | 7/2002 | Kaneko | G09G 3/3225 |
| | | | 345/60 |
| 2003/0142052 A1 | 7/2003 | Matsumoto | |
| 2010/0141644 A1 | 6/2010 | Lee et al. | |
| 2012/0147060 A1 | 6/2012 | Jeong | |
| 2013/0057532 A1 | 3/2013 | Lee et al. | |
| 2015/0054812 A1 | 2/2015 | Jeon | |
| 2015/0170576 A1 | 6/2015 | Bae | |
| 2015/0348466 A1 | 12/2015 | Park et al. | |
| 2016/0012775 A1 | 1/2016 | Jeong et al. | |
| 2016/0078809 A1 | 3/2016 | Yoon et al. | |
| 2017/0162145 A1 | 6/2017 | Huang et al. | |
| 2017/0301293 A1 | 10/2017 | Zhu et al. | |
| 2017/0358261 A1 | 12/2017 | Zhou | |
| 2018/0040275 A1 | 2/2018 | Wu | |
| 2018/0130410 A1 | 5/2018 | Gao et al. | |
| 2018/0158407 A1 | 6/2018 | Chai et al. | |
| 2018/0166021 A1 | 6/2018 | Xi et al. | |
| 2018/0166025 A1 | 6/2018 | Zhou et al. | |
| 2018/0374421 A1 | 12/2018 | Chen et al. | |
| 2019/0057646 A1 | 2/2019 | Lin et al. | |
| 2019/0096327 A1* | 3/2019 | Peng | G09G 3/3241 |
| 2019/0189053 A1 | 6/2019 | Kim et al. | |
| 2019/0213958 A1 | 7/2019 | Cho et al. | |
| 2019/0221165 A1 | 7/2019 | Park et al. | |
| 2019/0237019 A1 | 8/2019 | Gao et al. | |
| 2019/0295473 A1 | 9/2019 | Lu et al. | |
| 2020/0226978 A1 | 7/2020 | Lin et al. | |
| 2020/0372854 A1 | 11/2020 | Nam | |
| 2021/0049959 A1 | 2/2021 | Park et al. | |
| 2021/0104196 A1 | 4/2021 | Yuan | |
| 2021/0118361 A1 | 4/2021 | Li | |
| 2021/0125543 A1 | 4/2021 | Kim et al. | |
| 2021/0134219 A1 | 5/2021 | Huang et al. | |
| 2021/0167161 A1 | 6/2021 | Yang et al. | |
| 2021/0225282 A1* | 7/2021 | Cho | G09G 3/3233 |
| 2021/0264862 A1 | 8/2021 | Wang | |
| 2021/0327352 A1 | 10/2021 | Zhang et al. | |
| 2021/0335260 A1 | 10/2021 | Wang et al. | |
| 2021/0375198 A1 | 12/2021 | Zhang et al. | |
| 2021/0383743 A1 | 12/2021 | Yuan | |
| 2021/0407383 A1 | 12/2021 | Lai et al. | |
| 2021/0407386 A1 | 12/2021 | Li et al. | |
| 2021/0407390 A1 | 12/2021 | Li et al. | |
| 2022/0020330 A1 | 1/2022 | Cao et al. | |
| 2022/0319417 A1 | 10/2022 | Liu et al. | |
| 2023/0048014 A1 | 2/2023 | Wang et al. | |
| 2023/0133704 A1 | 5/2023 | Gai et al. | |
| 2023/0274688 A1 | 8/2023 | Cao et al. | |
| 2023/0360600 A1 | 11/2023 | Wang et al. | |

FOREIGN PATENT DOCUMENTS

| | | |
|---|---|---|
| CN | 106558287 A | 4/2017 |
| CN | 106910460 A | 6/2017 |
| CN | 107256695 A | 10/2017 |
| CN | 107274830 A | 10/2017 |
| CN | 107358918 A | 11/2017 |
| CN | 107492351 A | 12/2017 |
| CN | 107610651 A | 1/2018 |
| CN | 107799062 A | 3/2018 |
| CN | 207082320 U | 3/2018 |
| CN | 108133687 A | 6/2018 |
| CN | 108538243 A | 9/2018 |
| CN | 108777127 A | 11/2018 |
| CN | 108877655 A | 11/2018 |
| CN | 109243369 A | 1/2019 |
| CN | 109285500 A | 1/2019 |
| CN | 109599062 A | 4/2019 |
| CN | 109801592 A | 5/2019 |
| CN | 109949743 A | 6/2019 |
| CN | 110047428 A | 7/2019 |
| CN | 110047432 A | 7/2019 |
| CN | 110223636 A | 9/2019 |
| CN | 111063301 A | 4/2020 |
| CN | 111354307 A | 6/2020 |
| CN | 111402810 A | 7/2020 |
| CN | 111435587 A | 7/2020 |
| CN | 111445848 A | 7/2020 |
| CN | 111489701 A | 8/2020 |
| CN | 111613177 A | 9/2020 |
| CN | 111696484 A | 9/2020 |
| CN | 111710303 A | 9/2020 |
| CN | 111754921 A | 10/2020 |
| CN | 111968564 A | 11/2020 |
| CN | 111986622 A | 11/2020 |
| CN | 112116890 A | 12/2020 |
| CN | 112133242 A | 12/2020 |
| CN | 112397028 A | 2/2021 |
| CN | 112599099 A | 4/2021 |
| CN | 112634832 A | 4/2021 |
| CN | 112735314 A | 4/2021 |
| CN | 112785958 A | 5/2021 |
| CN | 112802431 A | 5/2021 |
| CN | 112908246 A | 6/2021 |
| CN | 113140179 A | 7/2021 |
| CN | 113160740 A | 7/2021 |
| CN | 113851083 A | 12/2021 |
| CN | 114222615 A | 3/2022 |
| CN | 114258320 A | 3/2022 |
| CN | 114514573 A | 5/2022 |
| EP | 4280201 A1 | 11/2023 |
| EP | 4300474 A1 | 1/2024 |
| JP | 2000221903 A | 8/2000 |
| JP | 2015132738 A | 7/2015 |
| KR | 20120064493 A | 6/2012 |
| KR | 20130026338 A | 3/2013 |

(56) References Cited

FOREIGN PATENT DOCUMENTS

| | | |
|---|---|---|
| KR | 20130055450 A | 5/2013 |
| KR | 20150064543 A | 6/2015 |
| KR | 20150073420 A | 7/2015 |
| WO | 2019242557 A1 | 12/2019 |
| WO | 2020124759 A1 | 6/2020 |
| WO | 2020258421 A1 | 12/2020 |
| WO | 2022061852 A1 | 3/2022 |

OTHER PUBLICATIONS

Oct. 25, 2024—(US) Non-Final Office Action—U.S. Appl. No. 18/548,974.

Dec. 6, 2024—(CN) First Office Action—App 202110898740.1 including English Translation.

Dec. 20, 2024—(CN) First Office Action—App 202110897625.2, including English Translation.

\* cited by examiner

PIXEL CIRCUIT AND DRIVING METHOD THEREFOR, DISPLAY SUBSTRATE, AND DISPLAY APPARATUS

This application is a U.S. National Phase Entry of International Application PCT/CN2022/104654, filed Jul. 8, 2022, designating the United States of America and claiming priority to International Patent Application No. PCT/CN2021/109894, filed Jul. 30, 2021 and Chinese Patent Application No. 202110897625.2, filed Aug. 5, 2021. The present application claims priority to and the benefit of the above-identified applications and the above-identified applications are incorporated by reference herein in their entirety.

TECHNICAL FIELD

Embodiments of the present disclosure relate to a pixel circuit and a driving method therefor, a display substrate and a display apparatus.

BACKGROUND

An organic light emitting diode (OLED) display has many advantages such as active light emission, high contrast, rapid response, and being light and thin, and thus has become one of major new generation displays. With the popularization of OLED displays in the high-end market, increasing requirements have been put forward on the quality of a screen, and more elaborated requirements have been put forward on design.

SUMMARY

At lease an embodiment of the present disclosure provides a pixel circuit, comprising a driving sub-circuit, a data writing sub-circuit, a first light emitting control sub-circuit, a first reset sub-circuit and a bias sub-circuit. The driving sub-circuit comprises a control terminal connected to a first node, a first terminal connected to a second terminal and a second terminal connected to a third node, and is configured to control according to a voltage of the control terminal a driving current which flows from the second node to the third node and is used for driving a light emitting element. The data writing sub-circuit is connected to the second node and is configured to write a data signal to the second node in response to a first scanning signal. The first light emitting control sub-circuit, connected to the second node and a first power voltage terminal and configured to write a first power voltage from the first power voltage terminal to the second node in response to a first light emitting control signal. The first reset sub-circuit, connected to the first node and configured to write a first reset voltage to the first node in response to a first reset control signal. The bias sub-circuit is connected to the second node and configured to write a reference voltage to the second node in response to a bias control signal to switch on the driving sub-circuit.

In some examples, an absolute value of a voltage difference between the reference voltage and the first reset voltage is a preset value; and the preset value is set such that an absolute value of a voltage difference between the control terminal and the first terminal of the driving sub-circuit is less than the preset value when the light emitting element is driven to emit light with a brightness of a highest gray level.

In some examples, the pixel circuit further comprises a second reset sub-circuit, and the second reset sub-circuit is connected to a fourth node and configured to be connected to a first electrode of the light emitting element through the fourth node and to write a second reset voltage to the fourth node in response to a second reset control signal.

In some examples, the bias control signal and the second reset control signal are a same signal.

In some examples, the pixel circuit further comprises a second light emitting control sub-circuit; the second light emitting control sub-circuit is connected to the third node and a fourth node and configured to be connected to a first electrode of the light emitting element through the fourth node; and the second light emitting control sub-circuit is configured to switch on the first node and the fourth node in response to a second light emitting control signal.

In some examples, the pixel circuit further comprises a compensation sub-circuit; the compensation sub-circuit is connected to the first node and the third node and configured to switch on the first node and the third node in response to a second scanning signal to control the driving sub-circuit to write a compensating voltage to the first node based on the data signal written into the second node.

In some examples, the pixel circuit further comprises a storage sub-circuit, and the storage sub-circuit comprises a first terminal and a second terminal which are connected to the first power voltage terminal and the first node, respectively.

In some examples, the bias sub-circuit comprises a bias transistor, and the first reset sub-circuit comprises a reset transistor; and the bias transistor is a P-type transistor, and the reset transistor is an N-type transistor.

At least an embodiment of the present disclosure further provides a display substrate, comprising: a base substrate; and a plurality of sub-pixels distributed in an array on the base substrate in a first direction and a second direction. At least one of the plurality of sub-pixels comprises the pixel circuit provided by any one of the above embodiment.

In some examples, the display substrate further comprises a bias control line extended in the first direction, the bias sub-circuit comprises a bias transistor; and the bias control line is electrically connected to a gate electrode of the bias transistor to provide the bias control signal.

In some examples, the display substrate further comprises a reference voltage line, and the reference voltage line is electrically connected to a first electrode of the bias transistor to provide the reference voltage; and the reference voltage line is on a side, away from the base substrate, of the bias control line.

In some examples, the display substrate further comprises a connection electrode, and a second electrode of the bias transistor is electrically connected to the first terminal of the driving sub-circuit through the connection electrode; and the connection electrode is on the side, away from the base substrate, of the bias control line.

In some examples, in a case where the pixel circuit comprises a second reset sub-circuit, the bias sub-circuit and the second reset sub-circuit are on a same side of the driving sub-circuit in the second direction.

In some examples, the second reset sub-circuit comprises a reset transistor; and the bias control line is further electrically connected to a gate electrode of the reset transistor to provide the second reset control signal.

In some examples, the first reset sub-circuit and the bias sub-circuit are on two opposite sides of the driving sub-circuit in the second direction.

In some examples, the display substrate further comprises a first reset control line extended in the first direction, and the first reset sub-circuit comprises a reset transistor; and the first reset control line is electrically connected to a gate electrode of the reset transistor to provide the first reset control signal.

In some examples, the display substrate further comprises a first reset voltage line extended in the first direction, and the first reset voltage line is electrically connected to a first electrode of the reset transistor to provide the first reset voltage.

In some examples, in a direction perpendicular to the base substrate, the first reset voltage line is on a side, close to the base substrate, of an active layer of the reset transistor, and the first reset control line is on a side, away from the base substrate, of the active layer of the reset transistor.

At least an embodiment of the present disclosure further provides a display apparatus, comprising the display substrate provided by any one of the above embodiments.

At least an embodiment of the present disclosure further provides a driving method for the pixel circuit provided by any one of the above embodiments, comprising: at an initialization phase, switching on the first reset sub-circuit to write the first reset voltage to the first node and switching on the bias sub-circuit to write the reference voltage to the second node to switch on the driving sub-circuit; and at a data writing phase, switching on the data writing sub-circuit to write the data signal to the second node, wherein the initialization phase is prior to the data writing phase.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1:
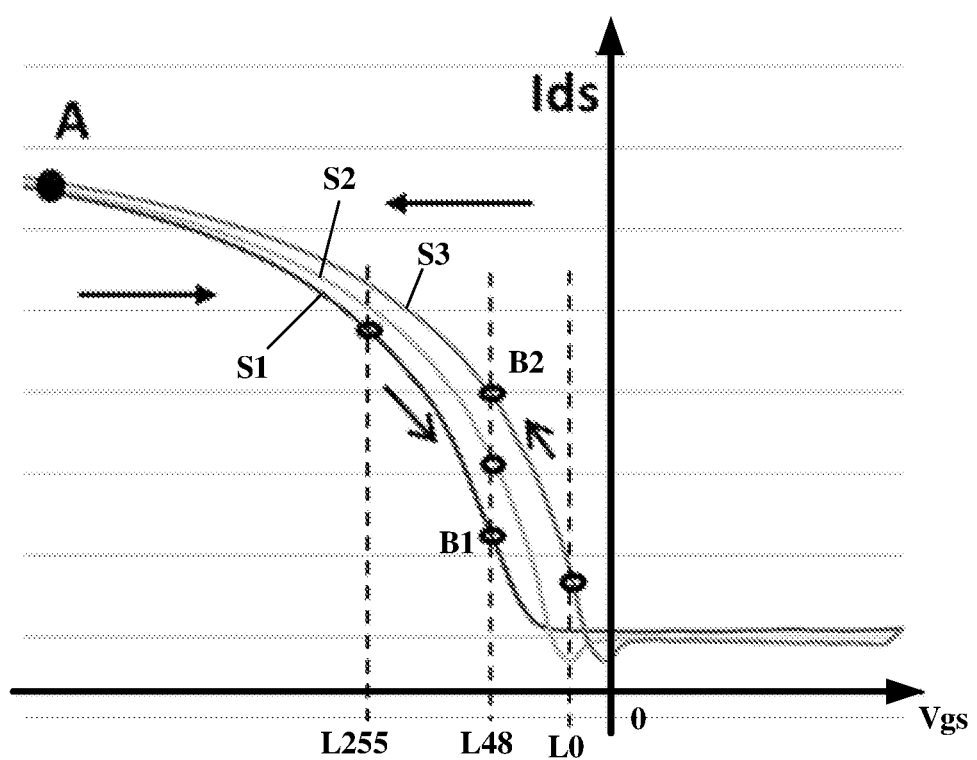
FIG. 1 is a schematic diagram illustrating a characteristic curve of a transistor.

The following will clearly and completely describe the technical solutions in the embodiments of this disclosure with reference to the non-limiting example embodiments shown in the drawings and detailed in the following description, and more fully explain the example embodiments of the present disclosure and their various features and advantageous details. It should be noted that the features shown in the figures are not necessarily drawn to scale. The present disclosure omits descriptions of known materials, components, and process techniques so as not to obscure example embodiments of the present disclosure. The examples given are only intended to facilitate understanding of the implementation of the exemplary embodiments of the present disclosure and further enable those skilled in the art to implement the exemplary embodiments. Therefore, these examples should not be understood as limiting the scope of the embodiments of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Similarly, similar terms such as "a", "an", or "the", etc., do not indicate the limitation of quantity, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," and the like are only used to indicate relative position relationship, and when the position of the described object is changed, the relative position relationship may be changed accordingly.

The inventors have found that a characteristic (e.g., a magnitude of a threshold voltage) of a driving thin-film transistor (DTFT) in a pixel circuit in a current cycle is related to a light emitting condition (e.g., a written gray-level data signal) of a previous cycle or a gray level of a display picture. The characteristic of the DTFT may fluctuate due to the light emitting condition of the previous cycle. As a result, a driving signal of a current frame is related not only to the gray-level data signal of the current frame but also to the gray-level data signal of a previous frame, leading to a lag phenomenon. The lag phenomenon may cause undesirable phenomena such as short-term ghost shadow, slow response and flicker.

At least one embodiment of the present disclosure provides a pixel circuit, including a driving sub-circuit, a data writing sub-circuit, a first light emitting control sub-circuit, a first reset sub-circuit and a bias sub-circuit. The driving sub-circuit includes a control terminal connected to a first node, a first terminal connected to a second terminal and a second terminal connected to a third node and is configured to control according to a voltage of the control terminal a driving current that flows from the second node to the third node and serves for driving a light emitting element. The data writing sub-circuit is connected to the second node and configured to write a data signal to the second node in response to a first scanning signal. The first light emitting control sub-circuit is connected to the second node and a first power voltage terminal and configured to write a first power voltage from the first power voltage terminal to the second node in response to a first light emitting control signal. The first reset sub-circuit is connected to the first node and configured to write a first reset voltage to the first node in response to a first reset control signal. The bias sub-circuit is connected to the second node and configured to write a reference voltage to the second node in response to a bias control signal to switch on the driving sub-circuit.

The pixel driving circuit provided by at least one embodiment of the present disclosure is provided with the first reset sub-circuit and the bias sub-circuit and thus can reset the first node connected to the control terminal of the driving sub-circuit and the second node connected to the first terminal of the driving sub-circuit before the start of a data writing phase (e.g., at an initialization phase) in a current cycle, thereby switching on the driving sub-circuit and biasing the driving sub-circuit to have a unified initial state, thus alleviating poor display due to the lag phenomenon.

FIG. 1 illustrates a diagram of characteristic curves of a driving transistor of a pixel circuit. The three characteristic curves are characteristic curves of the driving transistor after displaying a picture with a gray level of 255 (corresponding to curve C1), a picture with a gray level of 48 (corresponding to curve C2) and a picture with a gray level of 0 (corresponding to curve C3) by the pixel circuit in a previous cycle, respectively. The horizontal axis of the characteristic curve represents a difference (Vgs) between a gate voltage and a source voltage of the driving transistor, and the vertical axis represents a driving current (Ids) generated by the driving transistor. For example, as shown in FIG. 1, the driving transistor is a P-type transistor with a threshold voltage of less than 0. With increasing gray-level data of a previous cycle, the threshold voltage of the driving transistor drifts leftwards.

Intersection points of three dotted lines and three characteristic curves in FIG. 1 represent the characteristics of the transistors when the data gray level of the current frame is 255 (L255), 48 (L48) and 0 (L0) in the case of a gray level of 255, a gray level of 48 and a gray level of 0 written in the previous frame, respectively. As shown, in the case where the written data or the gray level of the display picture in the previous frame is different, the driving transistor may generate a different driving current even though the same data is written in the current frame. For example, as shown in FIG. 1, when the gray level of the display picture of the previous frame is 255 and data with a gray level of 48 is written in the current frame, the driving transistor will follow the characteristic curve S1, and a small driving current will be obtained at point B1 along the downward arrow in FIG. 1. When data with a gray level of 0 is written in the previous frame and data with a gray level of 48 is written in the current frame, the driving transistor will follow the characteristic curve S3, and a large driving current will be obtained at point B2 along the upward arrow in FIG. 1.

For example, the inventors have also found that the characteristic of the driving transistor is further related to a scanning direction of a gate voltage; and when the scanning direction of the gate voltage of the driving transistor is different, the characteristic of the driving transistor is also different.

For example, in the case that the driving transistor is a low-temperature polycrystalline silicon film thin-film transistor (LTPS-TFT), the lag phenomenon is mainly caused by an inter-layer defect between the polycrystalline silicon and a gate insulating layer and a defect within the gate insulating layer. When the gate electrode of the driving transistor receives a voltage, the defects of the gate insulating layer will capture current carriers, resulting in that the driving transistor has different characteristic curves during forward scanning and reverse scanning, thus leading to the lag phenomenon and causing undesirable phenomena such as long response time of a first frame and short-term ghost shadow.

For example, in the pixel circuit provided by at least one embodiment of the present disclosure, an absolute value of a difference between the reference voltage and the first reset voltage is a preset value. The preset value is set such that an absolute value of a voltage difference Vgs between the control terminal and the first terminal of the driving sub-circuit is less than the preset value when the driving sub-circuit drives the light emitting element to emit light with a brightness of a highest gray level (i.e., a gray level of 255).

For example, when the driving sub-circuit drives the light emitting element to emit light with a brightness of the highest gray level, i.e., a written data signal enables the pixel circuit to display a picture with the highest gray level, the voltage difference Vgs between the control terminal and the first terminal of the driving sub-circuit is: Vgs=Vd_L255+Vth−VDD, wherein Vd_L255 represents the data signal written in the pixel circuit when the light emitting element emits the light with the brightness of the highest gray level, Vth represents the current threshold voltage of the driving sub-circuit, and Vdd represents the first power voltage.

With such a setting, the driving sub-circuit is in a large positive bias or negative bias state. Thus, no matter what gray-level data is written in the current frame, a unified scanning direction can be obtained. The above-mentioned lag phenomenon is further improved.

For example, when the threshold voltage of the driving sub-circuit is less than 0, the above setting enables the driving sub-circuit to be in a large negative bias state, and enables the driving sub-circuit to be in a state, e.g., at point A in FIG. 1. Thus, single forward scanning can be realized no matter whether the previous frame is a black picture or a white picture or another picture, thereby improving a current difference caused by the lag phenomenon.

Figure 2A:
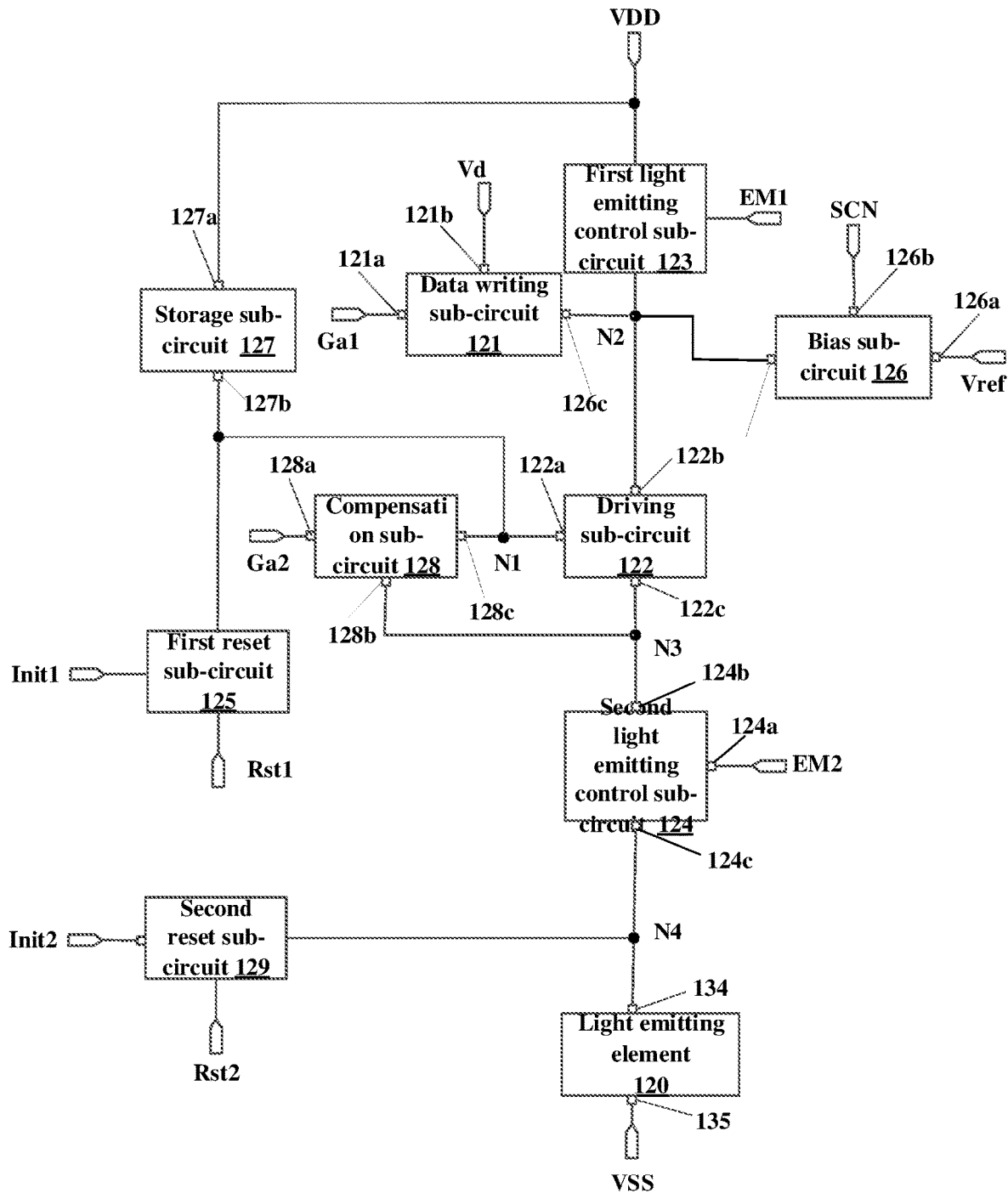
FIG. 2A is a schematic diagram of a pixel circuit provided by at least one embodiment of the present disclosure.

FIG. 2A is a schematic diagram of a pixel circuit provided by at least one embodiment of the present disclosure. As shown in FIG. 2A, the pixel circuit includes a driving sub-circuit 122, a data writing sub-circuit 121, a first light emitting control sub-circuit 123, a first reset sub-circuit 125 and a bias sub-circuit 126.

The driving sub-circuit 122 includes a control terminal 122a connected to a first node N1, a first terminal 122b connected to a second node N2 and a second terminal 122c connected to a third node N3 and is configured to control according to a voltage of the control terminal N1 a driving current that flows from the second node N1 to the third node N3 and serves for driving a light emitting element 120.

The data writing sub-circuit 121 is connected to the second node N2 and configured to write a data signal Vd to the second node N2 in response to a first scanning signal Ga1. For example, the data writing sub-circuit 121 includes a control terminal 121a configured to receive the first scanning signal Ga1, a first terminal 121b configured to receive the data signal Vd and a second terminal 121c connected to the second node N2. For example, at a data writing phase, the data writing sub-circuit 121 may be switched on in response to a first scanning signal Ga1 so that a data signal can be written in the first terminal 122b of the driving sub-circuit 122 (the second node N2), and the data signal is stored so that a driving signal for driving the light emitting element 120 to emit light can be generated according to the data signal, e.g., at a light emitting phase.

The first light emitting control sub-circuit 123 is connected to a first power voltage terminal VDD and the second node N2 and configured to write a first power voltage VDD from the first power voltage terminal VDD to the second node N2 in response to a first light emitting control signal EM1.

The first reset sub-circuit 125 is connected to the first node N1 and configured to write a first reset voltage Init1 to the first node N1 in response to a first reset control signal Rst1.

The bias sub-circuit 126 is connected to the second node N2 and configured to write a reference voltage to the second node N2 in response to a bias control signal SCN to switch on the driving sub-circuit.

For example, at an initialization phase, the first reset sub-circuit 125 and the bias sub-circuit 126 are switched on in response to the first reset control signal Rst1 and the bias control signal SCN, respectively, to apply the first reset voltage Init1 to the first node N1 and the reference voltage Vref to the second node N2 such that the driving sub-circuit 122 is switched on and biased. Thus, an initial state of the driving sub-circuit can be adjusted, and poor display due to a lag phenomenon in the light emitting phase of a previous phase can be ameliorated.

For example, in some examples, an absolute value of the first reset voltage Init1 is greater than 1.5 times the threshold voltage of the driving sub-voltage to guarantee that a bias effect can be achieved rapidly in a short time. For example, the absolute value of the first reset voltage Init1 may be, but not limited to, greater than 2 times, 2.5 times or 3 times of an absolute value of the threshold voltage.

For example, a magnitude of the first reset voltage Init1 is greater than 0.

For example, the first reset voltage Init1 ranges from 4 V to 10 V, and the threshold voltage of the driving sub-circuit is generally −5 V to −2 V. alternatively, the threshold voltage of the driving sub-circuit may be −3 V.

For example, as shown in FIG. 2A, the pixel circuit may further include a compensation sub-circuit 128 connected to the first node N1 and the third node N3 and configured to switch on the first node N1 and the third node N3 in response to a second scanning signal Ga2 to control the driving sub-circuit 122 to write a compensating voltage to the first node N1 based on the data signal Vd written in the second node N2. For example, the compensation sub-circuit 128 includes a control terminal 128a configured to receive the second scanning signal Ga2, a first terminal 128b connected to the third node N3 and a second terminal 128c connected to the first node N1.

For example, the first scanning signal Ga1 may be identical to or different from the second scanning signal Ga2. For example, the first scanning signal Ga1 and the second scanning signal Ga2 are inversion signals to each other.

For example, the pixel circuit may further include a storage sub-circuit 127. The storage sub-circuit 127 includes a first terminal 127a and a second terminal 127b that are connected to the first power voltage terminal VDD and the first node N1, respectively. For example, at a data writing and compensation phase, the compensation sub-circuit 128 may be switched on in response to the second scanning signal Ga2 so that the data signal written by the data writing sub-circuit 121 is stored in the storage sub-circuit 127. Meanwhile, the compensation sub-circuit 128 may switch on the first node N1 and the third node N3, i.e., electrically connect the control terminal 122a and the second terminal 122c of the driving sub-circuit 122, so that related information of the threshold voltage of the driving sub-circuit 122 can be correspondingly stored in the storage sub-circuit. Thus, the stored data signal and threshold voltage may be used to control the driving sub-circuit 122, e.g., at the light emitting phase such that the driving sub-circuit 122 is compensated.

For example, the pixel circuit may further include a second light emitting control sub-circuit 129 connected to a fourth node N4 and configured to be connected to a first electrode 134 of the light emitting element 120 through the fourth node N4. The second light emitting control sub-circuit 129 is configured to control a driving current to be switched on between the third node N3 and the fourth node N4 in response to a second light emitting control signal EM2 so that the driving signal can be applied to the light emitting element 120. For example, the first light emitting control sub-circuit 129 includes a control terminal 129a configured to receive the second light emitting control signal EM2, and a first terminal 129b and a second terminal 129c that are connected to the third node N3 and the fourth node N4, respectively.

For example, the second light emitting control signal EM2 and the first light emitting control signal EM1 may be a same signal or different signals.

For example, at the light emitting phase, the second light emitting control sub-circuit 129 is switched on in response to the second light emitting control signal EM2 provided by a second light emitting control terminal EM2 so that the driving sub-circuit 122 can be electrically connected to the light emitting element 120 through the second light emitting control sub-circuit 129, thereby driving the light emitting element 120 to emit light under the control of a driving current. At a non-light-emitting phase, the second light emitting control sub-circuit 129 is switched off in response to the second light emitting control signal EM2, avoiding a current from flowing through the light emitting element 120 to allow it to emit light. A contrast of a corresponding display apparatus can be increased.

For example, the pixel circuit may further include a second reset sub-circuit 123 connected to the fourth node N4 and configured to be connected to the first electrode 134 of the light emitting element 120 through the fourth node N4. The second reset sub-circuit 123 is configured to write a second reset voltage Init2 to the fourth node N4 in response to a second reset control signal Rst2.

For example, the second reset voltage ranges from −2 V to −6 V.

For example, the second reset control signal Rst2 and the bias control signal SCN may be identical or different.

For example, the second reset control signal Rst2 and the bias control signal SCN are connected to a same signal output terminal. For example, the second reset control signal Rst2 and the bias control signal SCN are transmitted through a same scan line.

In some other examples, the second reset control signal Rst2 and the bias control signal SCN may also be different. For example, the second reset control signal Rst2 and the bias control signal SCN are connected to different signal output terminals. For example, the second reset control signal Rst2 and the bias control signal SCN are transmitted through different scan lines, respectively.

For example, the second reset sub-circuit 129 may be switched on in response to the second reset control signal Rst2 so that the second reset voltage Init2 can be applied to the first electrode 134 of the light emitting element 120. Thus, the first electrode 134 of the light emitting element 120 can be reset, eliminating the influence of a previous light emitting phase.

For example, the light emitting element 120 includes a first electrode 134 and a second electrode 135. The first electrode 134 of the light emitting element 120 is configured to be connected to the second terminal 122c of the driving sub-circuit 122, and the second electrode 135 of the light emitting element 120 is configured to be connected to a second power voltage terminal VSS.

It needs to be noted that in the description of the embodiments of the present disclosure, the first node N1, the second node N2, the third node N3 and the fourth node N4 do not necessarily represent actually existing components, and instead, represent junctions of related circuit connections in a circuit diagram.

It needs to be noted that in the description of the embodiments of the present disclosure, symbol Vd may represent either a data signal terminal or a level of a data signal. Likewise, symbols Ga1 and Ga2 may represent either a first scanning signal and a second scanning signal or a first scanning signal terminal and a second scanning signal terminal; symbols EM1 and EM2 may represent either a first light emitting control signal and a second light emitting control signal or a first light emitting control terminal and a second light emitting control terminal; symbols Rst1 and Rst2 may represent either a first reset control signal and a second reset control signal or a first reset control terminal and a second reset control terminal; symbols Init1 and Init2 may represent either a first reset voltage terminal and a second reset voltage terminal or levels of a first reset voltage and a second reset voltage; symbol SCN may represent either a bias control terminal or a bias control signal; symbol Vref may represent either a reference voltage terminal or a level of a reference voltage; symbol VDD may represent either a first power voltage terminal or a first power voltage; and symbol VSS may represent either a second power voltage terminal or a second power voltage. They are the same as above in the following embodiments, which will not be described redundantly.

Figure 2B:
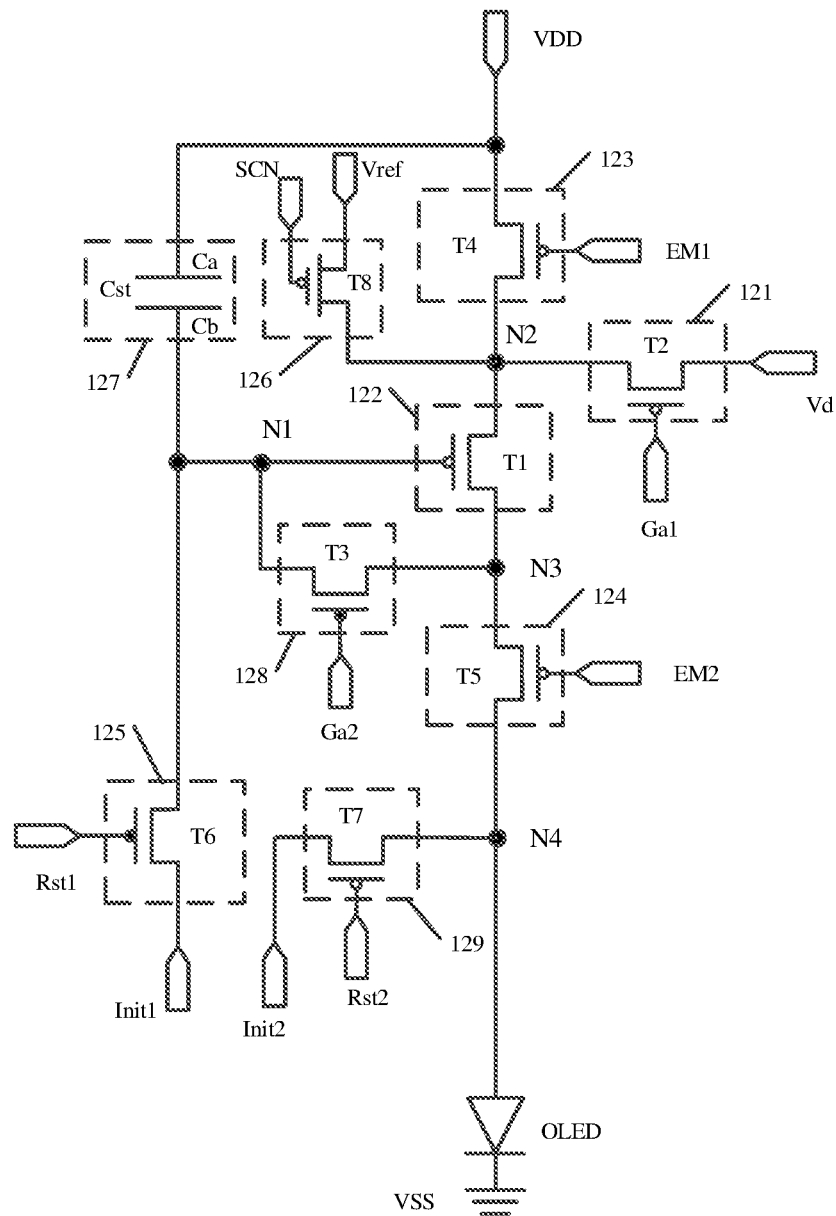
FIG. 2B is a circuit diagram of a specific implementation example of the pixel circuit shown in FIG. 2A.

FIG. 2B is a circuit diagram of a specific implementation example of the circuit shown in FIG. 2A. As shown in FIG. 2B, the pixel circuit includes a first to eighth transistors T1, T2, T3, T4, T5, T6, T7 and T8, as well as a storage capacitor Cst.

For example, as shown in FIG. 2B, the driving sub-circuit 122 may be implemented as the first transistor T1 (i.e., a driving transistor). A gate electrode of the first transistor T1 acts as the control terminal 122a of the driving sub-circuit 122 and is connected to the first node N1. A first electrode of the first transistor T1 acts as the first terminal 122b of the driving sub-circuit 122 and is connected to the second node N2. A second electrode of the first transistor T1 acts as the second terminal 122c of the driving sub-circuit 122 and is connected to the third node N3.

For example, as shown in FIG. 2B, the data writing sub-circuit 121 may be implemented as the second transistor T2. A gate electrode of the second transistor T2 is connected to a first scan line (a first scanning signal terminal Ga1) to receive the first scanning signal. A first electrode of the second transistor T2 is connected to a data line (a data signal terminal Vd) to receive the data signal. A second electrode of the second transistor T2 is connected to the first terminal 122b of the driving sub-circuit 122 (the second node N2).

For example, as shown in FIG. 2B, the compensation sub-circuit 128 may be implemented as the third transistor T3 (i.e., a compensating transistor). A gate, a first electrode and a second electrode of the third transistor T3 act as the control terminal 128a, the first terminal 128b and the second terminal 128c of the compensation sub-circuit, respectively. A gate electrode of the third transistor T3 is connected to a second scan line (a second scanning signal terminal Ga2) to receive the second scanning signal. A first electrode of the third transistor T3 is connected to the second terminal 122c of the driving sub-circuit 122 (the third node N3). A second electrode of the third transistor T3 is connected to the control terminal 122a of the driving sub-circuit 122 (the first node N1).

For example, as shown in FIG. 2B, the first light emitting control sub-circuit 123 may be implemented as the fourth transistor T4. A gate electrode of the fourth transistor T4 is electrically connected to a first light emitting control line to receive the first light emitting control signal. A first electrode and a second electrode of the fourth transistor T4 are electrically connected to the first power voltage terminal VDD and the first terminal 122b of the driving sub-circuit 122 (the second node N2).

For example, as shown in FIG. 2B, the first reset sub-circuit 125 may be implemented as the sixth transistor T6 (i.e., a reset transistor). A gate electrode of the sixth transistor T6 is configured to be connected to a first reset control line (the first reset control terminal) to receive the first reset control signal Rst1. A first electrode of the sixth transistor T6 is connected to a first reset voltage line to receive the first reset voltage Init1. A second electrode of the sixth transistor T6 is configured to be connected to the first node N1.

For example, as shown in FIG. 2B, the bias sub-circuit 126 may be implemented as an eighth transistor T8 (i.e., a bias transistor). A gate electrode of the eighth transistor T8 is configured to be electrically connected to a bias control line (the bias control terminal) to receive the bias control signal SCN. A first electrode of the eighth transistor T8 is electrically connected to a reference voltage line (a reference terminal) to receive the reference voltage Vref. A second electrode of the eighth transistor T8 is electrically connected to the first terminal 122b of the driving sub-circuit 122 (the second node N2).

For example, as shown in FIG. 2B, the second reset sub-circuit 129 may be implemented as the seventh transistor T7. A gate electrode of the seventh transistor T7 is configured to be connected to a second reset control line to receive the second reset control signal Rst2. A first electrode of the seventh transistor T7 is connected to a second reset voltage line to receive the second reset voltage Init2. A second electrode of the seventh transistor T7 is configured to be connected to the fourth node N4.

For example, as shown in FIG. 2B, the second light emitting control sub-circuit 124 may be implemented as the fifth transistor T5. A gate electrode of the fifth transistor T5 is connected to a second light emitting control line (the second light emitting control terminal EM2) to receive the second light emitting control signal EM2. A first electrode and a second electrode of the fifth transistor T5 are connected to the third node N3 and the fourth node N4, respectively.

For example, as shown in FIG. 2B, the storage sub-circuit 127 may be implemented as the storage capacitor Cst. The storage capacitor Cst includes a first capacitor electrode Ca connected to the first power voltage terminal VDD and a second capacitor electrode Cb connected to the control terminal 122a of the driving sub-circuit 122.

For example, the light emitting element 120 is specifically implemented as a light emitting diode (LED), e.g., an organic LED (OLED), a quantum-dot LED (QLED) or an inorganic LED, such as a micro LED or a micro OLED. For example, the light emitting element 120 may be of a top-emitting structure, a bottom-emitting structure or a double-sided emitting structure. The light emitting element 120 may emit red light, green light, blue light, white light or the like. The embodiments of the present disclosure have no particular limitation on the specific structure of the light emitting element. For example, the light emitting element 120 includes a first electrode 134, a second electrode 135, and a light emitting layer sandwiched between the first electrode 134 and the second electrode 135.

For example, the first electrode 134 (also referred to as a pixel electrode, e.g., a negative electrode) of the light emitting element 120 is connected to the fourth node N4. A second electrode 135 (e.g., a negative electrode) of the light emitting element 120 is configured to be connected to the second power voltage terminal VSS to receive the second power voltage VSS. A current flowing from the second terminal 122c of the driving sub-circuit 122 into the light emitting element 120 determines the brightness of the light emitting element. For example, the second power voltage terminal may be grounded. That is, VSS may be 0 V. For example, the second power voltage VSS may also be a negative voltage.

For example, the pixel circuit needs to switch on the driving transistor T1 at a threshold compensation phase, and therefore, the voltage difference Init1–VDD between the first reset voltage Init1 and the first power voltage VDD needs to be less than the threshold voltage Vth of the driving transistor T1. For example, the first reset voltage Init1 may range from –2 V to –6 V, e.g., be –2 V, –3 V, –4 V, –5 V or –6 V. For example, Init1–VDD may be less than a*Vth, where a value range of a may be 2 to 7; for example, a may be 2, 4, 6 or 7; and Vth may be –2 V to –5 V, e.g., –2 V, –3 V or –5 V. VDD may be greater than 1.5 times Vth. For example, VDD may be 1.6 times, 1.8 times or 2 times the Vth.

For example, a width-length ratio W/L of the eighth transistor T8 may be approximately equal to a width-length ratio W/L of the seventh transistor T7. For another example, the width-length ratio W/L of the eighth transistor T8 may be greater than the width-length ratio W/L of the seventh transistor T7. That is, the width-length ratio W/L of T8 may be slightly greater so that the node N2 can be reset rapidly.

For example, the eighth transistor T8 has a channel width W of 1.5 to 3.5, such as 1.6, 1.8, 1.9, 2.0, 2.2, 2.5 and 3.0, and a channel length L of 2.0 to 4.5, such as 2.5, 2.7, 3.0, 3.2, 3.5 and 4.0. The seventh transistor T7 has a channel width W of 1.5 to 3.5, such as 1.6, 1.8, 1.9, 2.0, 2.2, 2.5 and 3.0, and a channel length L of 2.0 to 4.5, such as 2.5, 2.7, 3.0, 3.2, 3.5 and 4.0.

For example, the width-length ratio W/L of the eighth transistor T8 may be approximately equal to a width-length ratio W/L of the sixth transistor T6. For another example, the width-length ratio W/L of the eighth transistor T8 may be less than the width-length ratio W/L of the sixth transistor T6. Thus, a balance may be achieved between the reset capabilities of the node N1 and the node N2.

For example, the width-length ratio W/L of the eighth transistor T8 may be greater than the width-length ratio W/L of the sixth transistor T6. Thus, the reset capability of the node N2 may be improved.

For example, the eighth transistor T8 has the channel width W of 1.5 to 3.5, such as 1.6, 1.8, 1.9, 2.0, 2.2, 2.5 and 3.0, and the channel length L is 2.0 to 4.5, such as 2.5, 2.7, 3.0, 3.2, 3.5 and 4.0. The sixth transistor T6 has a channel width W of 1.5 to 3.5, such as 1.6, 1.8, 1.9, 2.0, 2.2, 2.5 and 3.0, and a channel length L of 2.0 to 4.5, such as 2.5, 2.7, 3.0, 3.2, 3.5 and 4.0.

It needs to be noted that all the transistors used in the embodiments of the present disclosure may be thin-film transistors or field effect transistors or other switching devices having the same characteristics. The thin-film transistor is described as an example in the embodiments of the present disclosure. The source and the drain of a transistor used herein may be structurally symmetrical and thus may be structurally indistinguishable. In an embodiment of the present disclosure, to distinguish between other two electrodes than the gate electrode of the transistor, one electrode is directly described as the first electrode, while the other electrode as the second electrode.

Moreover, transistors may be divided into an N-type transistor and a P-type transistor by the characteristic of a transistor. When the transistor is a P-type transistor, a switch-on voltage is a low-level voltage (e.g., 0 V, –5 V, –10 V or other suitable voltage), and a switch-off voltage is a high-level voltage (e.g., 5 V, 10 V or other suitable voltage). When the transistor is an N-type transistor, a switch-on voltage is a high-level voltage (e.g., 5 V, 10 V or other suitable voltage), and a switch-off voltage is a low-level voltage (e.g., 0 V, –5 V, –10 V or other suitable voltage).

For example, the first transistor T1, the second transistor T2, the fourth transistor T4, the fifth transistor T5, the seventh transistor T7 and the eighth transistor T8 are P-type transistors, e.g., low-temperature polycrystalline silicon film thin-film transistors (LTPS-TFTs). The third transistor T3 and the sixth transistor T6 are N-type transistors, e.g., metal oxide thin-film transistors.

The LTPS-TFTs have a high carrier mobility, can be fabricated at a low temperature required and are compatible with a glass substrate, and thus have been extensively applied to an OLED display substrate. A display apparatus using the LTPS-TFTs has the advantages of high resolution, rapid response, high brightness, high aperture ratio, etc.

The stability of the gate voltage of the driving transistor (i.e., the first transistor T1) has an important influence on the display uniformity of a display substrate. For example, if the leakage current from the gate electrode of the driving transistor is serious, the gate voltage of the driving transistor may be insufficient at the threshold compensation phase; that is, the threshold voltage of the driving transistor is not compensated completed; as a result, a driving current at the light emitting phase is still related to the threshold voltage Vth of the driving transistor, leading to reduced brightness uniformity of a display apparatus.

The metal oxide thin-film transistors have the advantage of small leakage current. Since the third transistor T3 and the sixth transistor T6 are transistors directly connected to the gate electrode of the first transistor T1 (i.e., the driving transistor). Therefore, the stability of the third transistor T3 and the sixth transistor T6 directly affects the stability of the voltage of the gate electrode of the first transistor T1 (the node N1). Adopting N-type metal oxide thin-film transistors as the third transistor T3 and the sixth transistor is conducive to reducing the leakage current of the transistors and thus conducive to maintaining the voltage of the node N1. Thus, at the compensation phase, the threshold voltage of the first transistor T1 can be fully compensated, and then the display uniformity of the display substrate at the light emitting phase is improved.

Figure 2C:
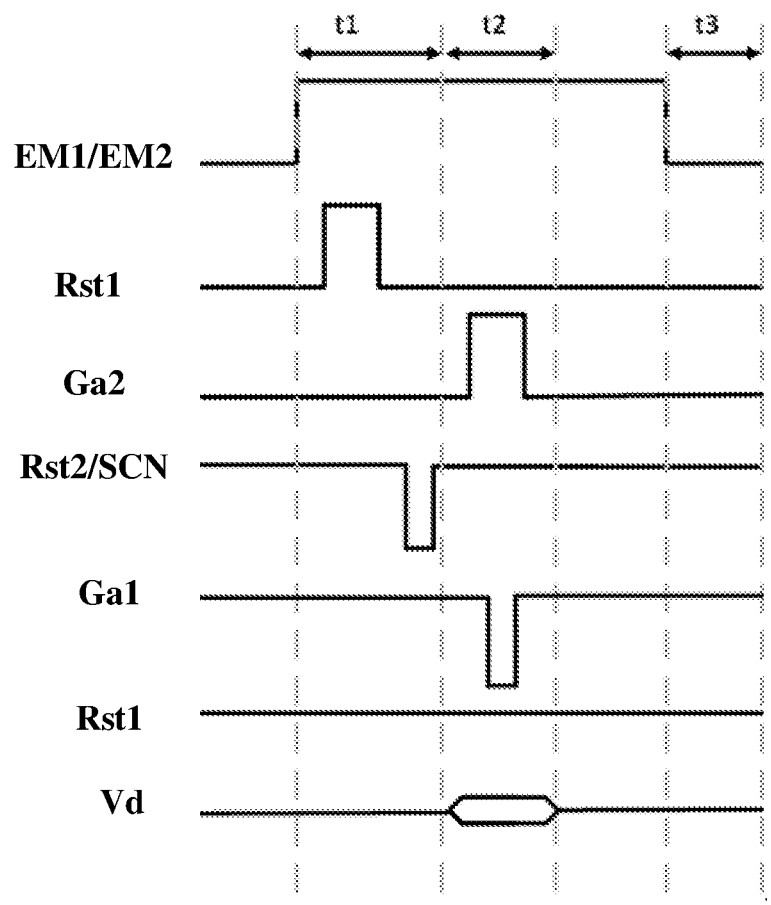
FIG. 2C is a timing signal diagram of a pixel circuit provided by at least one embodiment of the present disclosure.
Figure 2D:
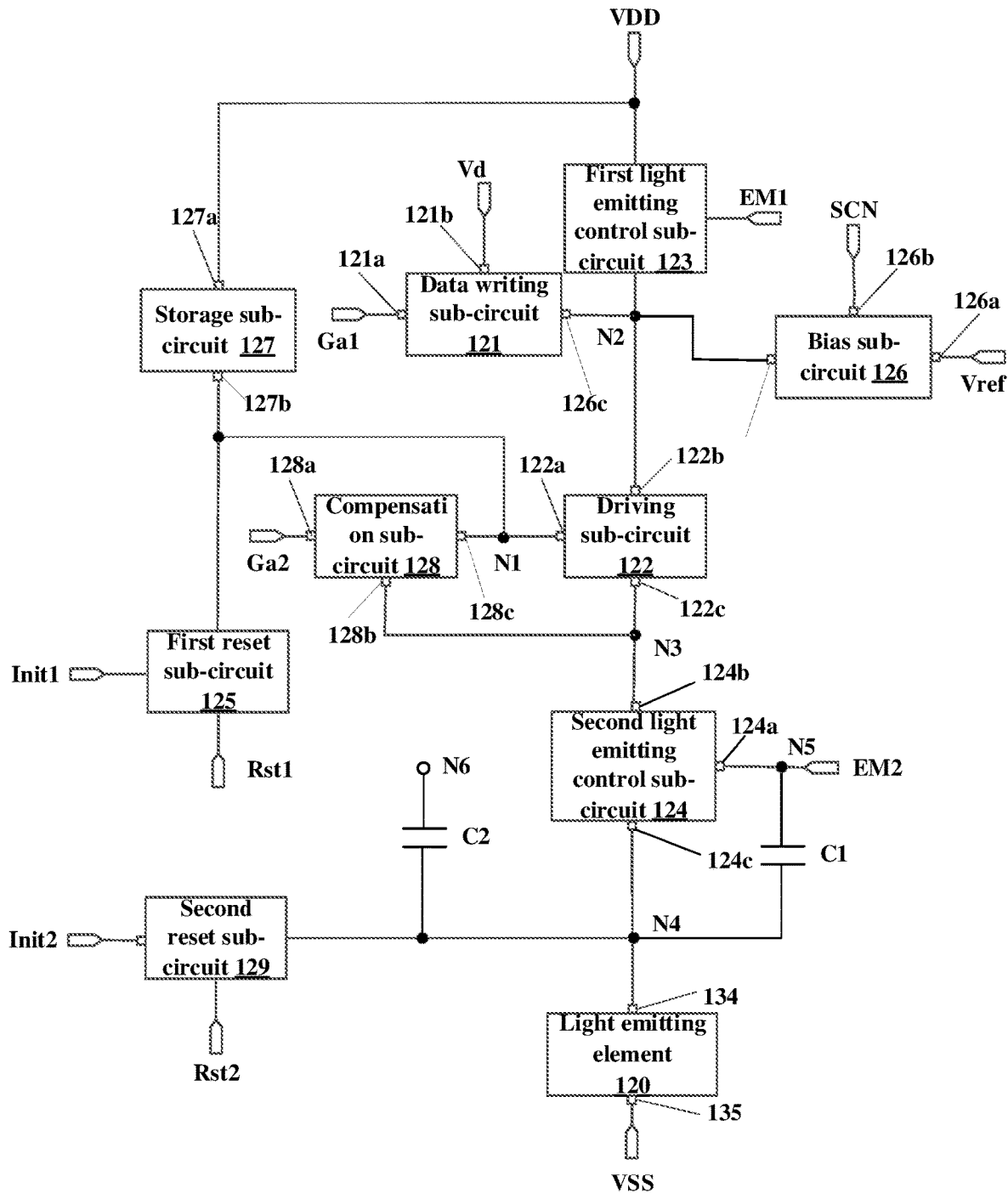
FIG. 2D to FIG. 2G are schematic diagrams of a pixel circuit provided by some other embodiments of the present disclosure.
Figure 2E:
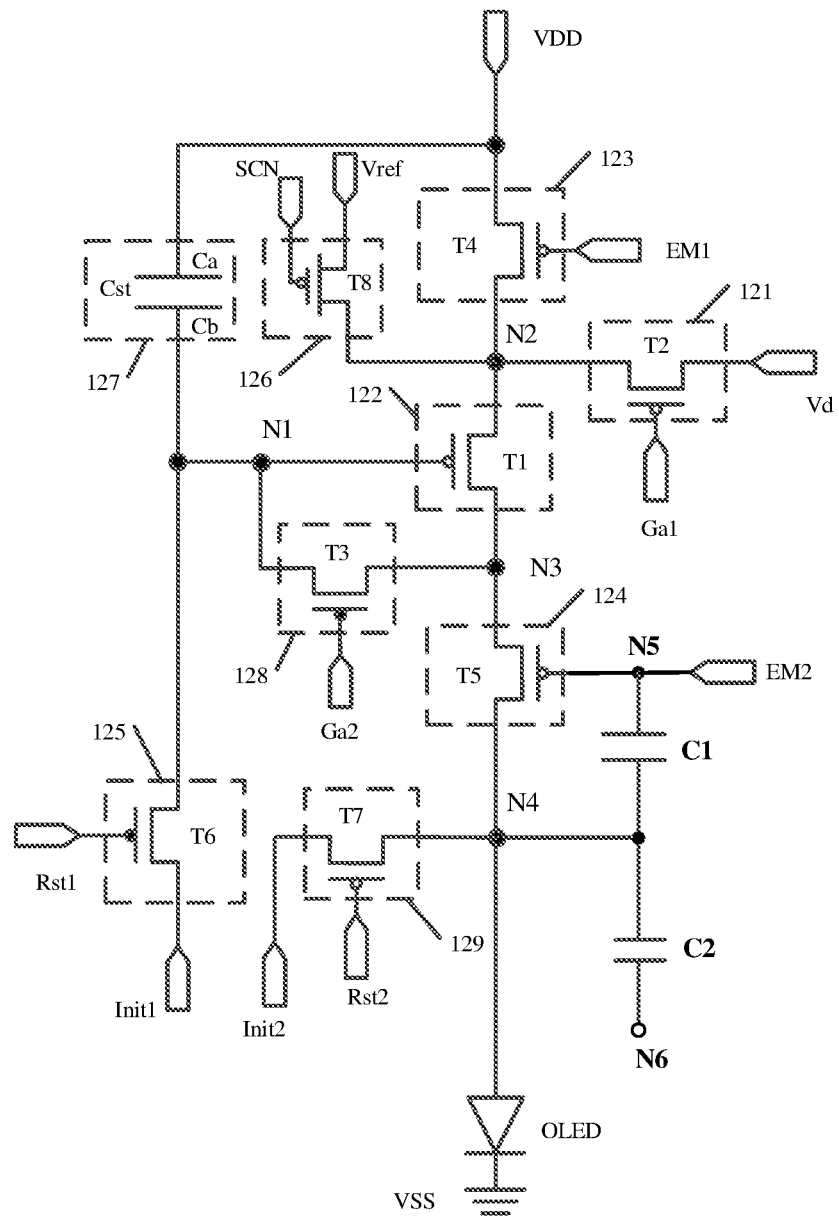

The working principle of the pixel circuit shown in FIG. 2B is explained below with reference to the signal timing diagram shown in FIG. 2C. As shown in FIG. 2C, the display process of an image of each frame includes an initialization phase t1, a data writing and compensation phase t2 and a light emitting phase t3.

As shown in FIG. 2C, in the present embodiment, the first light emitting control signal EM1 and the second light emitting control signal EM2 are the same signal, and the second reset control signal Rst2 and the bias control signal SCN are the same signal. The second scanning signal Ga2 of sub-pixels of a current row and the first reset control signal Rst1 of sub-pixels of a previous row are the same in waveform, i.e., are the same signal. However, this may not be construed as a limitation to the present disclosure.

At the initialization phase 1, the first reset control signal Rst1 is input to switch on the sixth transistor T6, and the first reset voltage Init1 is applied to the gate electrode of the first transistor T1 (the first node N1), thus resetting the first node N1. The second reset control signal Rst2 is input to switch on the eighth transistor T8 and the seventh transistor T7, thus applying the reference voltage Vref to the first electrode of the first transistor T1 (the second node N2), and the second reset voltage Init2 is applied to the first electrode 134 of the light emitting element 120 (the fourth node N4), thus resetting the second node N2 and the fourth node N4, respectively.

The first reset voltage Init1 and the reference voltage Vref enable the first transistor T1 to be switched on. When the first transistor T1 is a P-type transistor, Init1−Vref is less than 0 and an absolute value thereof is greater than the absolute value of the threshold voltage Vth of the first transistor T1.

The first transistor T1 is biased at the initialization phase and allowed to have a unified initial state, thus ameliorating the lag phenomenon caused by a previous light emitting phase.

At the data writing and compensation phase 2, the first scanning signal Ga1, the second scanning signal Ga2 and the data signal Vd are input to switch on the second transistor T2 and the third transistor T3. The data signal Vd is written to the second node N2 by the second transistor T2, and the first node N1 is charged through the first transistor T1 and the third transistor T3. The first transistor T1 is switched off when the potential of the first node N1 changes to Vd+Vth, wherein Vth is the threshold voltage of the first transistor T1. The potential of the first node N1 is retained by being stored in the storage capacitor Cst. In other words, voltage information with the data signal and the threshold voltage Vth is stored in the storage capacitor Cst for subsequently providing gray-level display data and compensate the threshold voltage of the first transistor T1 at the light emitting phase.

Since the first transistor T1 is pre-biased at the initialization phase, a particular unified characteristic curve is exhibited, which is not affected by the light emitting phase of the previous frame.

For example, the absolute value of the difference between the reference voltage and the first reset voltage is a preset value. The preset value is set such that the absolute value of a voltage difference (i.e., Vd_L255+Vth−VDD) between the gate and the first electrode of the first transistor T1 is less than the preset value when the light emitting element is driven to emit light with the brightness of the highest gray level (i.e., the gray level of 255), wherein Vd_L255 represents the data signal written in the pixel circuit when the light emitting element emits the light with the brightness of the highest gray level.

With such a setting, the first transistor T1 is in a large positive bias or negative bias state. Thus, no matter what gray-level data is written in the current frame, a unified scanning direction can be obtained. The above-mentioned lag phenomenon is further improved.

For example, when the first transistor T1 is the P-type transistor, the threshold voltage Vth of the first transistor T1 is less than 0, and the above setting enables the first transistor T1 to be in the large negative bias state, e.g., enables the driving sub-circuit to be in a state at point A in FIG. 1. Thus, single forward scanning can be realized simultaneously no matter whether the previous frame is a black picture or a white picture or another picture, thereby improving a current difference caused by the lag phenomenon.

At the light emitting phase 4, the first light emitting control signal EM1 and the second light emitting control signal EM2 are input to switch on the fourth transistor T4 and the fifth transistor T5, respectively, and the fifth transistor T5 applies a driving current to an OLED such that the OLED emits light. A value of the driving current Ids flowing through the OLED may be derived according to the following formula: Ids=K (VGS−Vth)$^2$=K[(Vd+Vth−VDD)−Vth]$^2$=K(Vd−VDD)$^2$, wherein K is an electrical conductivity coefficient.

In the above formula, Vth represents the threshold voltage of the first transistor T1; VGS represents a voltage between the gate and the source (which is the first electrode here) of the first transistor T1; and K is a constant related to the first transistor T1 itself. As can be seen from the above calculation formula of Ids, the driving Ids flowing through the OLED is no longer related to the threshold voltage Vth of the first transistor T1. Thus, compensation for the pixel circuit can be realized. The problem of threshold voltage drift of the driving transistor (the first transistor T1 in the embodiments of the present disclosure) due to the manufacturing process and long-time operation is solved, and its influence on the driving current Ids is eliminated. Accordingly, the display effect of a display apparatus using the same can be improved.

At least one embodiment of the present disclosure further provides a driving method for a pixel circuit, which is configured to drive the pixel circuit provided in any embodiment described above. The driving method includes at least: at an initialization phase, switching on the first reset sub-circuit to write the first reset voltage to the first node and switching on the bias sub-circuit to write the reference voltage to the second node to switch on the driving sub-circuit; and at a data writing phase, switching on the data writing sub-circuit to write the data signal to the second node, wherein the initialization phase is prior to the data writing phase. Specific descriptions may become apparent with reference to the above, which will not be redundantly described here.

FIG. 2D to FIG. 2G are schematic diagrams of a pixel circuit provided by some other embodiments of the present disclosure. The pixel circuit provided by the embodiments mainly differs from the pixel circuit provided by the embodiments shown in FIG. 2A to FIG. 2B by further including a first capacitor C1 and a second capacitor C2.

The inventors have found that in some cases of a layout of the pixel circuit, the fourth node N4 may be easily coupled to a fifth node N5 connected to the control terminal of the second light emitting control sub-circuit 124 to form a coupled capacitor, i.e., the first capacitor C1, which may be formed by disposing the fifth transistor T5 (the second light emitting control sub-circuit) connected to the fourth node N4 close to the first electrode 134 of the light emitting element 120. For example, as shown in FIG. 4B, in a direction perpendicular to the base substrate, the first electrode 134 of the light emitting element 120 overlaps the gate electrode of the fifth transistor T5 to form the first capacitor C1.

The first capacitor C1 allows a signal on the fourth node N4 to be easily affected by the jump of the second light emitting control signal EM2, thus affecting a voltage on the first electrode 134 of the light emitting element 120, which may easily lead to unstable light emitting brightness at the light emitting phase and a change at the voltage on the first electrode 134 at the non-light-emitting phase. Thus, a voltage difference between the first electrodes 134 of the light emitting elements of adjacent sub-pixels is caused, leading to lateral leakage current and hence cross color between the adjacent sub-pixels.

To ameliorate the above problem, a second capacitor may be disposed between the fourth node N4 and a sixth node N6, thus reducing the influence of the first capacitor C1 on the signal on the fourth node N4. The sixth node N6 may be other circuit node than the fifth node N5 in the pixel circuit.

For example, a signal loaded to the sixth node N6 and a signal loaded to the fifth node N5 are inversion signals to each other, thus balancing the influence of the first capacitor C1 on the signal on the fourth node N4.

For example, a fixed voltage signal may be loaded to the sixth node N6, thus stabilizing the signal on the fourth node N4. For example, the sixth node N6 is connected to a voltage line (e.g., a power voltage line or a reset voltage line).

Figure 2F:
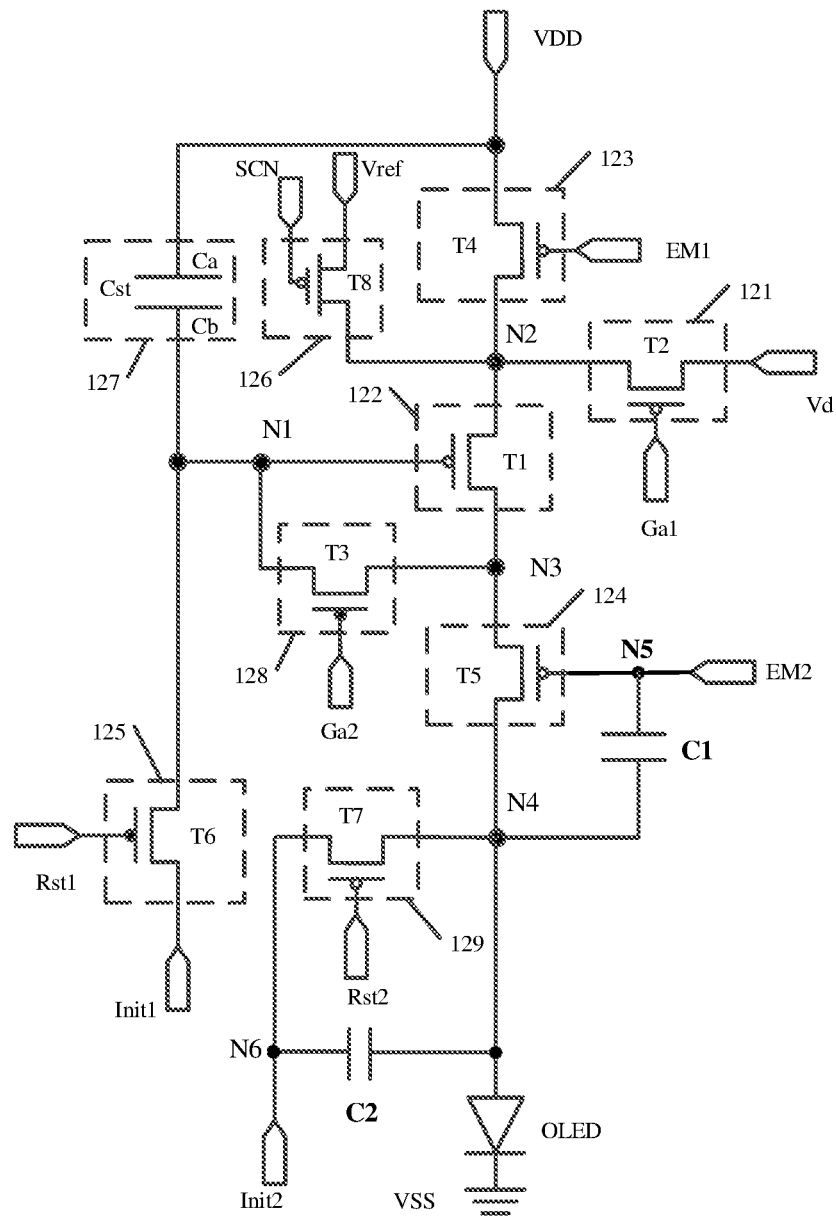

For example, with reference to FIG. 2F and below FIG. 4B, in the direction perpendicular to the base substrate, the first electrode 134 of the light emitting element 120 overlaps the second reset voltage line 407 in the direction perpendicular to the base substrate to form the second capacitor C2.

Figure 2G:
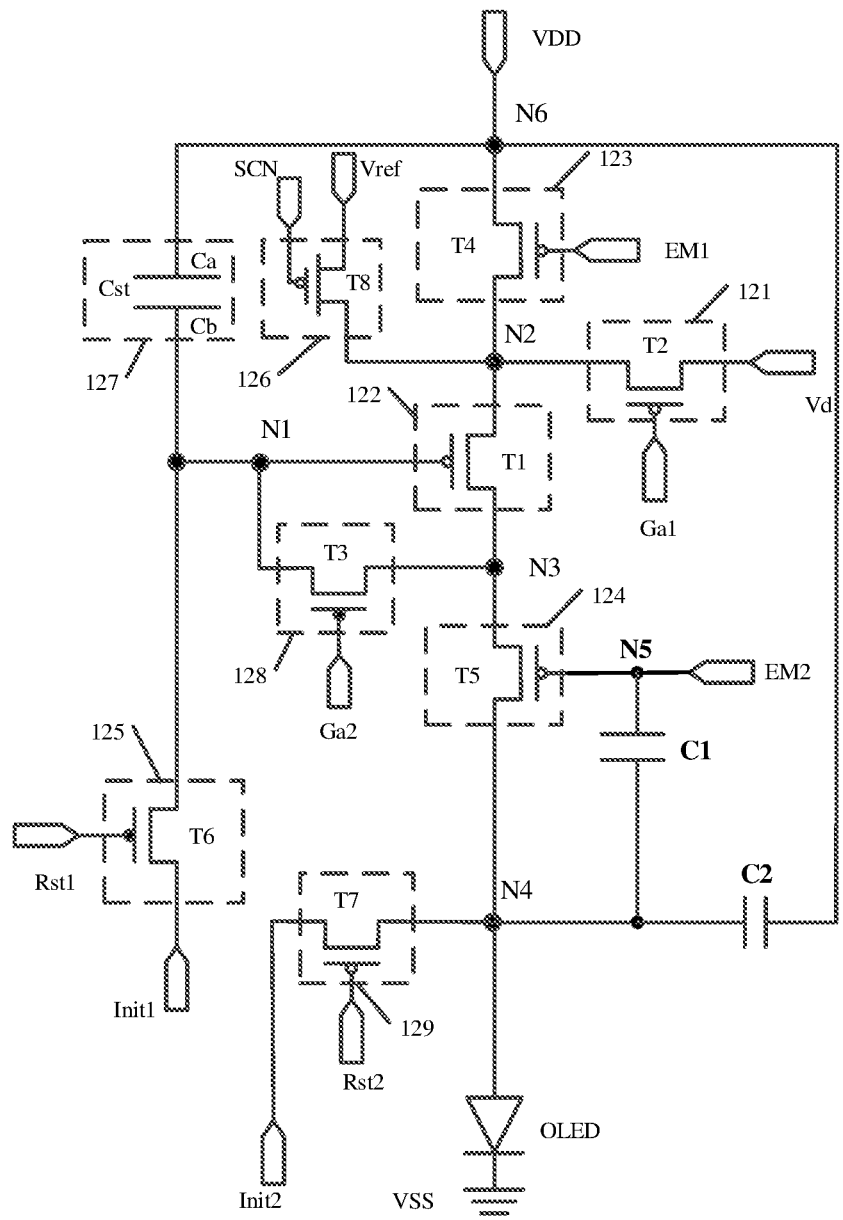

In some other examples, for example, with reference to FIG. 2G and below FIG. 4B, in the direction perpendicular to the base substrate, the first electrode 134 of the light emitting element 120 overlaps the first capacitor electrode Ca in the direction perpendicular to the base substrate to form the second capacitor C2. That is, the sixth node N6 is connected to the first power voltage terminal VDD.

For example, a capacitance value of the first capacitor C1 is less than that of the second capacitor C2. For example, the capacitance value of the first capacitor C1 may be 0.5 to 0.9 (e. g. 0.6, 0.7 and 0.8) times that of the second capacitor C2.

For example, the capacitance value of the second capacitor C2 may range from 3 fF to 7 fF, and may be 3.5 fF, 4 fF, 4.5 fF, 5 fF and 6fF for example. In this way, the lateral leakage current of a display substrate can be effectively reduced, thus ameliorating the problem of cross color.

At least one embodiment of the present disclosure further provides a display substrate including the pixel circuit provided in any embodiment described above.

Figure 3:
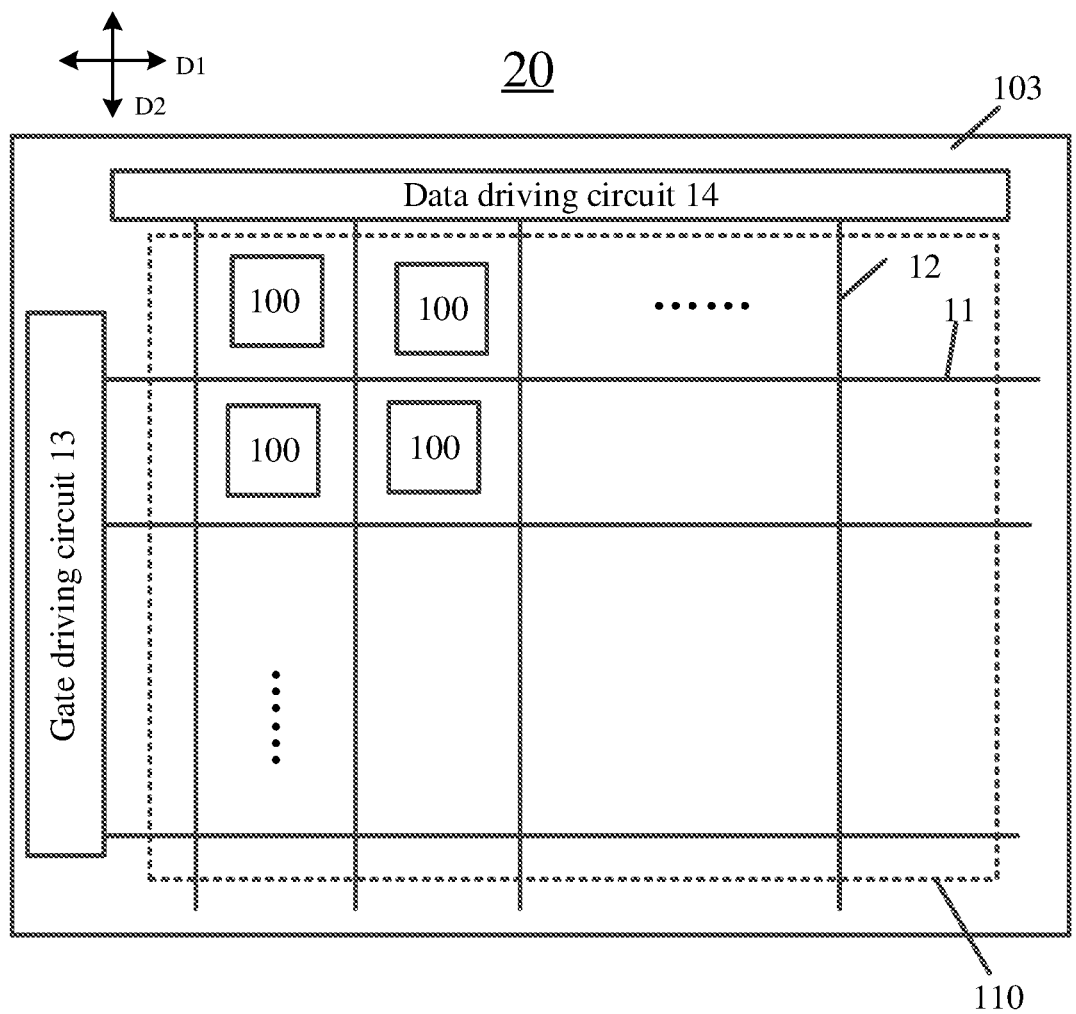
FIG. 3 is a first schematic diagram of a display substrate provided by at least one embodiment of the present disclosure.

FIG. 3 is a planar schematic diagram of a display substrate provided by at least one embodiment of the present disclosure. As shown in FIG. 3, the display substrate 20 includes a display region 110 and a non-display region 103 outside the display region 110. For example, the non-display region 103 is located at a peripheral region of the display region 110. The display substrate 20 includes a plurality of sub-pixels 100 located in the display region 110. For example, the plurality of sub-pixels are arranged in an array, e.g., arranged in a plurality of pixel rows and a plurality of pixel columns in a first direction D1 and a second direction D2. The first direction D1 and the second direction D2 are different, e.g., orthogonal to each other. For example, the pixel rows and the pixel columns do not necessarily extend in straight lines, and may also extend along curves (e.g., broken lines), each of which extends in the first direction D1 and the second direction D2 as a whole.

Each sub-pixel includes a pixel circuit for driving a light emitting element to emit light. A plurality of pixel circuits are arranged in an array in the first direction D1 and the second direction D2. For example, the sub-pixels form a pixel unit in a traditional RGB way to realize full-color display. The present disclosure has no limitations on the arrangement way of the sub-pixels and the way of realizing the full-color display.

For example, as shown in FIG. 3, the display substrate 20 further includes wires (e.g., gate lines 11) extended in the first direction D1 and a plurality of wires (e.g., data lines 12) extended in the second direction D2 in the display region 110. The plurality of transverse wires and the plurality of longitudinal wires cross each other to define a plurality of pixel regions in the display region 110. One sub-pixel 100 is correspondingly disposed in each pixel region. FIG. 3 merely illustrates a rough positional relationship of the gate lines 11, the data lines 12 and the sub-pixels 100 in the display substrate, which may be specifically designed according to actual requirements.

Each subpixel 100 includes a pixel circuit and a light emitting element. The pixel circuit is configured to drive the light emitting element to emit light. The pixel circuit of at least one sub-pixel 100 is the pixel circuit provided by any embodiment described above.

For example, the display substrate may further include a gate driving circuit 13 and a data driving circuit 14 that are located in the non-display region. The gate driving circuit 13 is connected to the pixel circuits through the gate lines 11 to provide various scanning signals, and the data driving circuit 14 is connected to the pixel circuits through the data lines 12 to provide data signals. The positional relationship of the gate driving circuit 13, the data driving circuit 14, the gate lines 11 and the data lines 12 illustrated in FIG. 3 is merely an example, and actual arrangement positions may be designed as needed.

For example, the display substrate 20 may further include a control circuit (not shown). For example, the control circuit is configured to control the data driving circuit 14 to apply the data signals and to control the gate driving sub-circuit to apply the scanning signals. One example of the control circuit is a timing control circuit (T-con). The control circuit may take various forms, for example, include a processor and a memory. The memory includes an executable code, and the processor runs the executable code to perform the above-mentioned detection method.

For example, the processor may be a central processing unit (CPU) or a processing unit in other form having data processing capability and/or instruction executing capability, for example, may include a microprocessor, a programmable logic controller (PLC), etc.

For example, the memory may include one or more computer program products. The computer program product may include a computer readable storage medium in any form, for example, a volatile memory and/or a nonvolatile memory. The volatile memory may include, for example, a random access memory (RAM) and/or a cache, etc. The nonvolatile memory may include, for example, a read only memory (ROM), a hard disk, a flash memory, etc. One or more computer program instruction may be stored on the computer readable storage medium, and the processor may run a function desired by the program instructions. Various application programs and various kinds of data may also be stored on the computer readable storage medium.

The structure of the display substrate provided by at least one embodiment of the present disclosure will be described exemplarily by taking the sub-pixel using the pixel circuit shown in FIG. 2B for example in conjunction with FIG. 4A to FIG. 4B, FIG. 5, FIG. 6, FIG. 7 and FIG. 8A to FIG. 8B, which, however, does not constitute a limitation to the present disclosure.

Figure 4A:
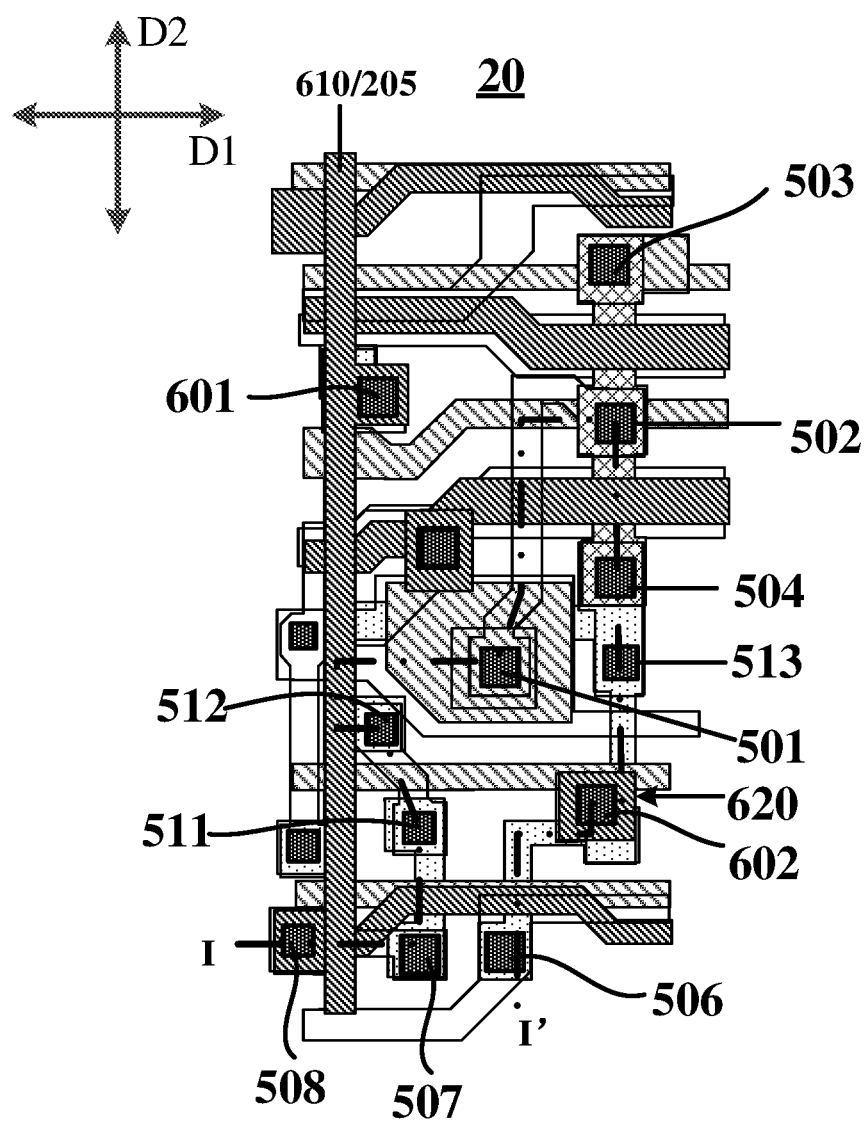
FIG. 4A is a second schematic diagram of a display substrate provided by at least one embodiment of the present disclosure.
Figure 4B:
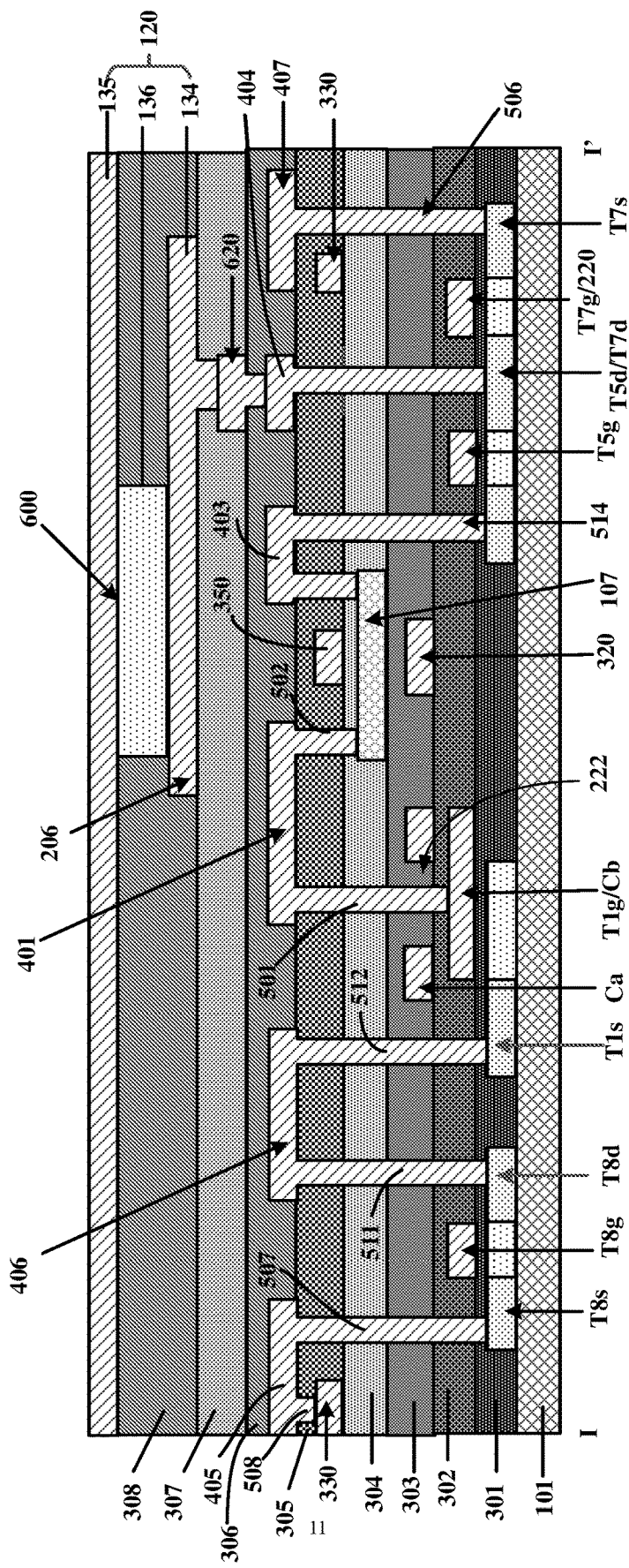
FIG. 4B is a sectional view taken along section line I-I' in FIG. 4A.

FIG. 4A is a schematic diagram of one sub-pixel in a display substrate 20 provided by at least one embodiment of the present disclosure, and FIG. 4B is one example of a sectional view taken along section line I-I' in FIG. 4A. It needs to be noted that for the sake of clarity, FIG. 4A illustrates merely a substrate structure below a light emitting element with the structure of the light emitting element being omitted; and some structures having no direct electrical connection relationship at the section line are omitted in FIG. 4B.

As shown in FIG. 4A to FIG. 4B, a first semiconductor layer 102, a first insulating layer 301, a first conductive layer 201, a second insulating layer 302, a second conductive layer 202, a third insulating layer 303, a second semiconductor layer 107, a fourth insulating layer 304, a third conductive layer 203, a fifth insulating layer 305, a fourth conductive layer 204, a sixth insulating layer 306, a fifth conductive layer 205, a seventh insulating layer 307 and a sixth conductive layer 206 are disposed on a base substrate 101 in sequence, thus forming the structure of the display substrate shown in FIG. 4A.

Figure 5:
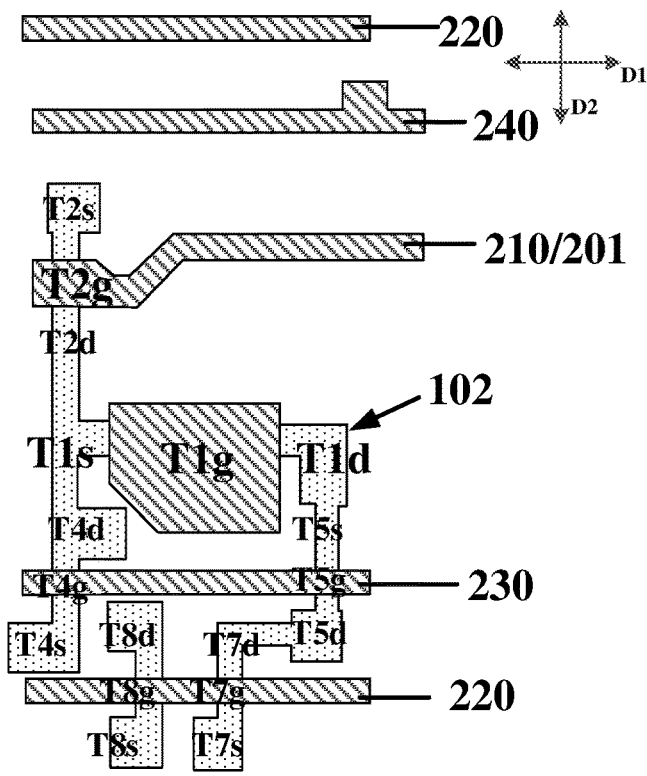
FIG. 5 is a third second schematic diagram of a display substrate provided by at least one embodiment of the present disclosure.
Figure 6:
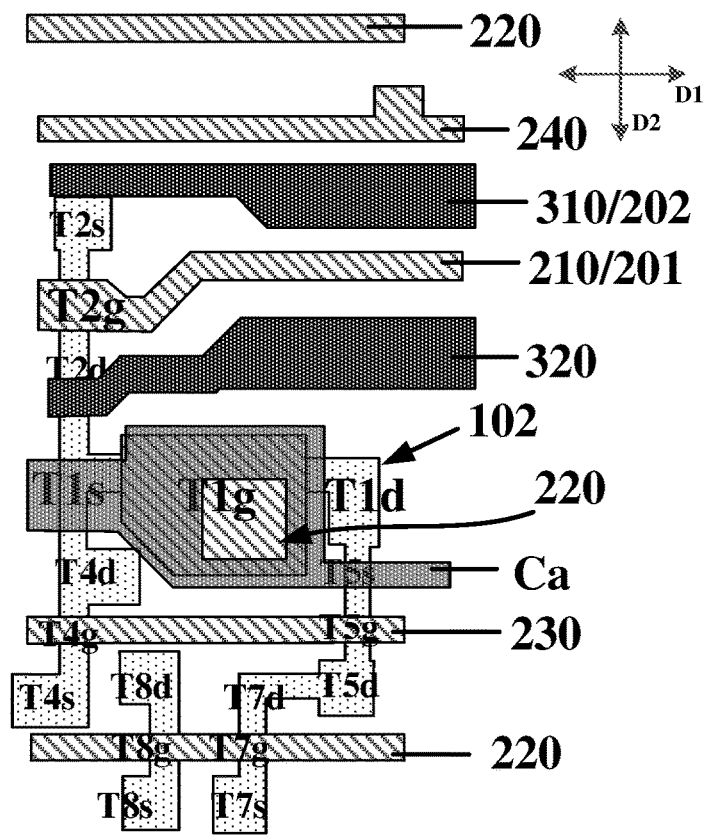
FIG. 6 is a fourth schematic diagram of a display substrate provided by at least one embodiment of the present disclosure.
Figure 7:
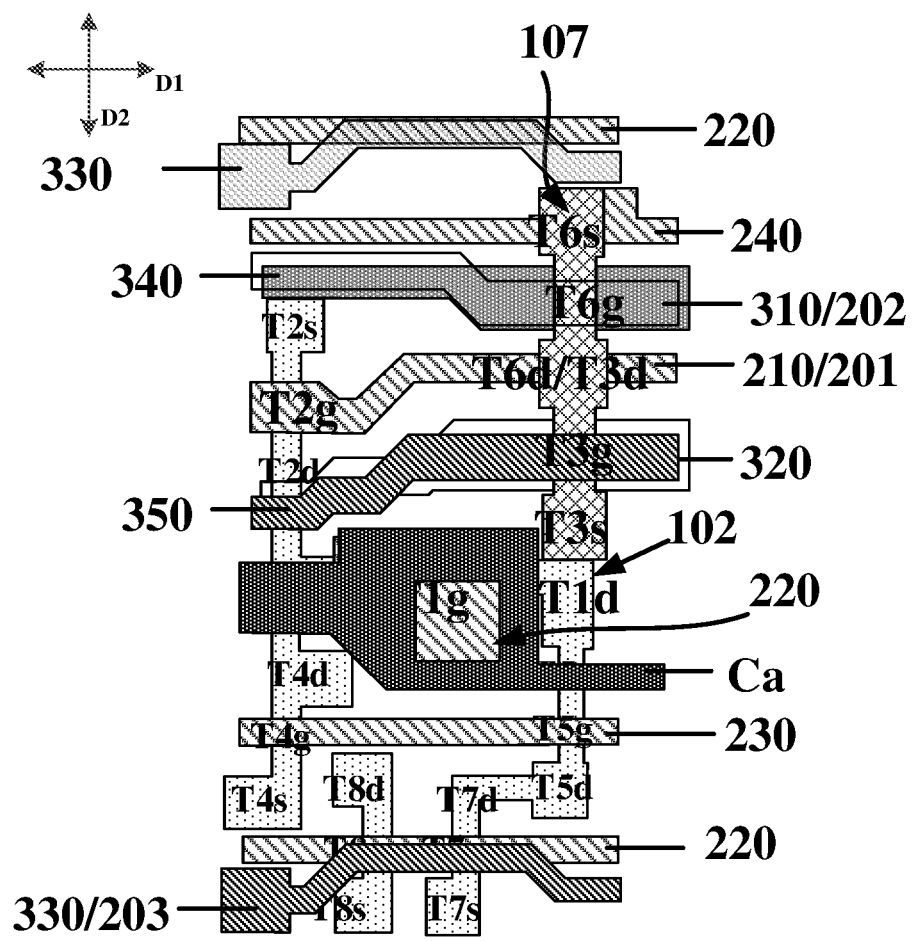
FIG. 7 is a fifth schematic diagram of a display substrate provided by at least one embodiment of the present disclosure.
Figure 8A:
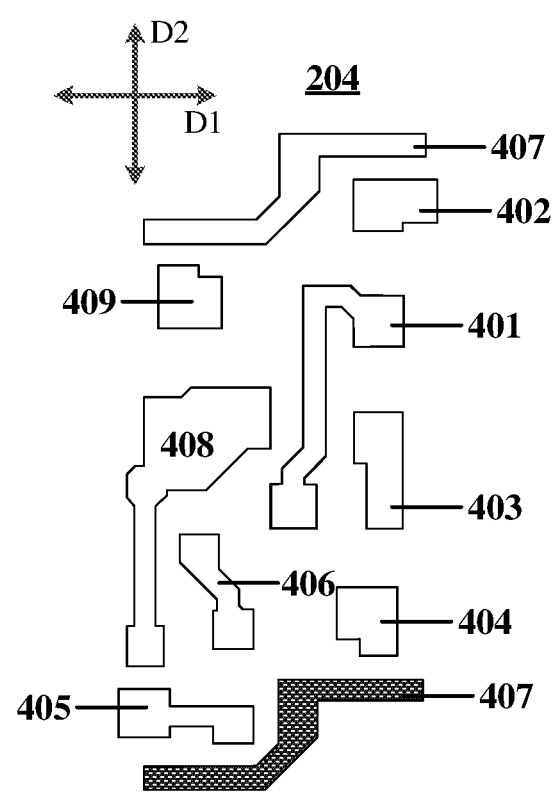
FIG. 8A is a sixth schematic diagram of a display substrate provided by at least one embodiment of the present disclosure.
Figure 8B:
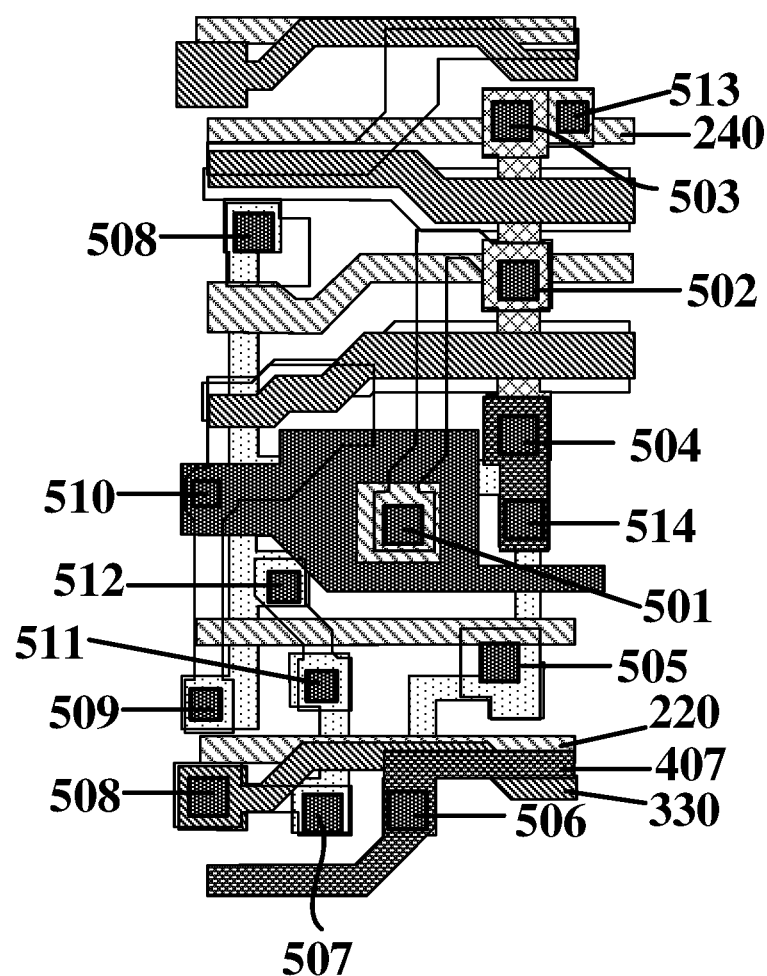
FIG. 8B is a seventh schematic diagram of a display substrate provided by at least one embodiment of the present disclosure.

FIG. 5 illustrates patterns of the first semiconductor layer 102 and the first conductive layer 201 of the sub-pixel corresponding to FIG. 4A; FIG. 6 illustrates the second conductive layer 202 on the basis of FIG. 5; FIG. 7 illustrates the second semiconductor layer 107 and the third conductive layer 203 on the basis of FIG. 6; FIG. 8A illustrates the fourth conductive layer 204; and FIG. 8B illustrates the fourth conductive layer 204 on the basis of FIG. 7.

For the convenience of description, the gate, the first electrode, the second electrode and a channel region of the nth transistor Tn are denoted by Tng, Tns, Tnd and Tna in the following description, respectively, wherein n is 1 to 8.

It needs to be noted that the so-called "disposed at a same layer" in the present disclosure refers to that two (or more than two) structures are formed through a same deposition process and patterned through a same patterning process, but are not necessarily located in a same horizontal plane, and may be made of a same material or different materials. It needs to be noted that the so-called "integrated structure" in the present disclosure refers to a structure that is formed by connecting two (or more than two) structures formed through a same deposition process and patterned through a same patterning process to each other, and the structures may be made of a same material or different materials.

For example, as shown in FIG. 5, the first semiconductor layer 102 includes the channel regions (T1a, T2a, T4a, T5a, T7a and T8a), the first electrodes (T1s, T2s, T4s, T5s, T7s and T8s) and the second electrodes (T1d, T2d, T4d, T5d, T7d and T8d) of the first transistor T1, the second transistor T2, the fourth transistor T4, the fifth transistor T5, the seventh transistor T7 and the eighth transistor T8.

For example, a self-aligned process is performed for the display substrate 20, using the first conductive layer 201 as a mask to process (e.g., dope) the first semiconductor layer 102 into a conductor such that a portion of the first semiconductor layer 102 which is not covered with the first conductive layer 201 becomes a conductor and thus, the portions, located on two sides of the channel region of each transistor, of the first semiconductor layer are formed into conductors to act as the first electrode and the second electrode of the transistor, respectively. For example, the first semiconductor layer 102 is made of a low-temperature polycrystalline silicon material.

For example, as shown in FIG. 5, the first conductive layer 201 further includes a first scan line 210, a reset control line (a second reset control line) 220, a light emitting control line 230 and a first reset voltage line 240 that extend in the first direction D1. For example, as shown in FIG. 5, each row of sub-pixels corresponds to one reset control line 220, one first scan line 210, one light emitting control line 230 and one first reset voltage line 240.

It needs to be noted that in the present disclosure, a signal extended in a direction refers to that a main body portion of the signal line extends in the direction and does not necessarily represent that the signal line is of a linear structure. For example, the signal line may include a bent structure or a protrusion or branch portion extended from the main body portion. This is the same as above in the following embodiments, which will not be described redundantly.

The first scan line 210 is electrically connected (or of an integrated structure) with the gate electrode of the second transistor T2 in the corresponding row of sub-pixels to provide a first scanning signal Ga1, and the reset control line 220 is electrically connected (or of an integrated structure) with the gate electrode of the seventh transistor T7 in the corresponding row of sub-pixels to provide a second reset control signal Rst2. The reset control line 220 is further electrically connected (or of an integrated structure) with the gate electrode of the eighth transistor T8 in the corresponding row of sub-pixels to provide a bias control signal SCN, and therefore, the reset control line 250 also acts as the bias control line. The light emitting control line 230 is electrically connected (or of an integrated structure) with the gates of the fourth transistor T4 and the fifth transistor T5 in the corresponding row of sub-pixels to provide a first light emitting control signal EM1 and a second light emitting control signal EM2.

For example, as shown in FIG. 6, the second conductive layer 202 includes a first capacitor electrode Ca. The first capacitor electrode Ca overlaps the gate T1g of the first transistor T1 in the direction perpendicular to the base substrate 101 to form a storage capacitor Cst. That is, the gate T1g of the first transistor T1 acts as a second capacitor electrode Cb of the storage capacitor Cst. For example, the first capacitor electrode Ca includes an opening 222. The opening 222 exposes at least a portion of the gate T1g of the first transistor T1 so that the gate T1g is electrically connected to other structure.

For example, the second conductive layer 202 may further include a first auxiliary control line 310 and a second auxiliary control line 320 which are extended in the first direction D1, which will be specifically described below with reference to FIG. 7.

For example, as shown in FIG. 7, the second semiconductor layer 170 includes the channel regions (T3a and T6a) of the third transistor T3 and the sixth transistor T6, the first electrodes (T3s and T6s) of the third transistor T3 and the sixth transistor T6, and the second electrodes (T3d and T6d) of the third transistor T3 and the sixth transistor T6.

For example, as shown in FIG. 7, the third conductive layer 203 includes a second scan line 350, a first reset control line 340 and a reference voltage line 330 which are extended in the first direction D1.

For example, the self-aligned process is performed for the display substrate 20, using the third conductive layer 203 as a mask to process (e.g., dope) the second semiconductor layer 107 into a conductor such that a portion of the second semiconductor layer 107 which is not covered with the third conductive layer 203 becomes a conductor. Thus, the portions, located on two sides of the channel regions of the third transistor T3 and the sixth transistor T6, of the second semiconductor layer are formed into conductors to act as the first electrodes and the second electrodes of the third transistor T3 and the sixth transistor T6, respectively.

For example, the second semiconductor layer 107 is made of a metal oxide semiconductor material, such IGZO, ZnO, AZO and IZTO materials.

For example, with reference to FIG. 4A to FIG. 4B and FIG. 7, in the direction perpendicular to the base substrate, the second scan line 350 overlaps at least in part the second auxiliary control line 320. For example, an orthographic projection of the channel region T3a, located below the second scan line 350, of the third transistor T3 on the base substrate is located within an orthographic projection of the second auxiliary control line 320 on the base substrate.

Thus, the second auxiliary control line 320 may serve as a shading layer to prevent light from being incident on the channel region of the third transistor T3 from the back of the channel region to produce a bad influence on the characteristic of the third transistor T3. For example, the metal oxide semiconductor material is sensitive to light. When the channel region of the third transistor T3 is made of the metal oxide semiconductor material, a threshold drift of the third transistor T3 may be caused easily when light is incident on the channel region. With the second auxiliary control line 320, the stability of the third transistor T3 can be improved, thereby further stabilizing the gate voltage of the first transistor T1.

For example, the second scan line 350 and the second auxiliary control line 320 are configured to receive a same scanning signal. Thus, the third transistor T3 forms a double-sided gate structure, thereby improving the gate control capability of the third transistor T3 and further stabilizing the gate voltage of the first transistor T1.

For example, with reference to FIG. 4A to FIG. 4B and FIG. 7, in the direction perpendicular to the base substrate, the first reset control line 340 overlaps at least in part the first auxiliary control line 310. For example, an orthographic projection of the channel region T6a, located below the first reset control line 340, of the sixth transistor T6 on the base substrate is located within an orthographic projection of the first auxiliary control line 310 on the base substrate.

Thus, the first auxiliary control line 310 may serve as a shading layer to prevent light from being incident on the channel region of the sixth transistor T6 from the back of the channel region to produce a bad influence on the characteristic of the sixth transistor T6. For example, the metal oxide semiconductor material is sensitive to light. When the channel region of the sixth transistor T6 is made of the metal oxide semiconductor material, a threshold drift of the sixth transistor T6 may be caused easily when light is incident on the channel region. With the first auxiliary control line 310, the stability of the sixth transistor T6 can be improved, thereby further stabilizing the gate voltage of the first transistor T1.

For example, the first reset control line 340 and the first auxiliary control line 310 are configured to receive a same scanning signal. Thus, the sixth transistor T6 forms a double-sided gate structure, thereby improving the gate control capability of the sixth transistor T6 and further stabilizing the gate voltage of the first transistor T1.

For example, with reference to FIG. 4A to FIG. 4B and FIG. 8A to FIG. 8B, the fourth conductive layer 204 includes a connection electrode 401. One end of the connection electrode 401 is electrically connected to the gate T1g of the first transistor T1 (i.e., the second capacitor electrode Cb) through the opening 222 in the first capacitor electrode Ca and a via hole 501 in an insulating layer, and the other end of the same is electrically connected to the second electrode T3d of the third transistor T3 through a via hole 502. Thus, the second capacitor electrode Cb is electrically connected to the second electrode T3d of the third transistor T3. For example, the via hole 501 penetrates through the second insulating layer 302, the third insulating layer 303, the fourth insulating layer 304 and the fifth insulating layer 305. For example, the via hole 502 penetrates through the fourth insulating layer 304 and the fifth insulating layer 305.

For example, as shown in FIG. 8A to FIG. 8B, the fourth conductive layer 204 further includes a connection electrode 402. The connection electrode 402 is electrically connected to the first electrode T6s of the sixth transistor T6 through a via hole 503 and is electrically connected to the first reset voltage line 240 through a via hole 513. Thus, the first electrode T6s of the sixth transistor T6 is electrically connected to the first reset voltage line 240 such that the first electrode T6s of the sixth transistor T6 is capable of receiving a first reset voltage Init1 from the first reset voltage line 240.

For example, with reference to FIG. 4A to FIG. 4B and FIG. 8A to FIG. 8B, the fourth conductive layer 204 further includes a connection electrode 403. The connection electrode 403 is electrically connected to the first electrode T3s of the third transistor T3 through a via hole 504 and is electrically connected to the first electrode T5s of the fifth transistor T5 through a via hole 514. Thus, the first electrode T3s of the third transistor T3 is electrically connected to the first electrode T5s of the fifth transistor T5.

For example, with reference to FIG. 4A to FIG. 4B and FIG. 8A to FIG. 8B, the fourth conductive layer 204 further includes a connection electrode 404. The connection electrode 404 is electrically connected to the second electrode T5d of the fifth transistor T5 and the second electrode T7d of the seventh transistor T7 through a via hole 505 to electrically connect the second electrode T5d of the fifth transistor T5 and the second electrode T7d of the seventh transistor T7 with the first electrode 134 of the light emitting element 120.

For example, with reference to FIG. 4A to FIG. 4B and FIG. 8A to FIG. 8B, the fourth conductive layer 204 further includes a connection electrode 405. The connection electrode 405 is electrically connected to the first electrode T8s of the eighth transistor T8 through a via hole 507 and is electrically connected to and the reference voltage line 330 through a via hole 508, thereby electrically connecting the first electrode T8s of the eighth transistor T8 with the reference voltage line 330.

For example, with reference to FIG. 4A to FIG. 4B and FIG. 8A to FIG. 8B, the fourth conductive layer 204 further includes a connection electrode 406. The connection electrode 406 is electrically connected to the second electrode T8d of the eighth transistor T8 through a via hole 511 and is electrically connected to the first electrode T1s of the first transistor T1 through a via hole 512, thereby electrically connecting the second electrode T8d of the eighth transistor T8 with the first electrode T1s of the first transistor T1. For example, with reference to FIG. 4A and FIG. 7, in the second direction D2, the eighth transistor T8 (i.e., the bias sub-circuit) and the seventh transistor T7 (i.e., the second reset sub-circuit) are located on the same side (a first side) of the first transistor T1 (i.e., the driving sub-circuit), and the sixth transistor T6 (i.e., the first reset sub-circuit) and the third transistor T3 (i.e., the compensation sub-circuit) are located on the same side (a second side) of the first transistor T1. The first side and the second side are two opposite sides of the first transistor T1 in the second direction D2.

Such a design allows the bias sub-circuit and the second reset sub-circuit to share a scan line (i.e., the second reset control line 220), and in the case where the second electrode T8d of the eighth transistor T8 is electrically connected to the first electrode T1s of the first transistor T1 (i.e., the second electrode T4d of the fourth transistor T4) through the connection electrode 406, the connection electrode 406 overlaps neither the first reset control line 340 nor the second scan line 350 in the direction perpendicular to the base substrate, thus avoiding a signal on the connection electrode 406 from causing interference with signals on the first reset control line 340 and the second scan line 350. In this way, the reset of the gate T1g of the first transistor T1 (i.e., the node N1) is enabled to be more stable.

For example, with reference to FIG. 4A to FIG. 4B and FIG. 8A to FIG. 8B, the fourth conductive layer 204 further includes a second reset voltage line 407. The second reset voltage line 407 is electrically connected to the first electrode T7s of the seventh transistor T7 through a via hole 506 such that the first electrode T7s of the seventh transistor T7 is capable of receiving a second reset voltage Init2 from the second reset voltage line 407.

For example, the second reset voltage line 407 extends roughly in the first direction D1 and includes a portion parallel to the first direction D1.

For example, with reference to FIG. 4A to FIG. 4B and FIG. 8B, in the direction perpendicular to the base substrate, the second reset control line 220, the reference voltage line 330 and the second reset voltage line 407 are at least partially overlapped with each other. In this way, a shading area of the signal line can be reduced as much as possible, and the aperture ratio of the display substrate can be effectively increased.

For example, as shown in FIG. 5 and FIG. 8A to FIG. 8B, the fourth conductive layer 204 further includes a connection electrode 408 configured to load a first power voltage VDD. The connection electrode 408 is electrically connected to the first electrode T4s of the fourth transistor T4 and the first capacitor electrode Ca through a via hole 509 and a via hole 510, respectively.

For example, as shown in FIG. 8A to FIG. 8B, the fourth conductive layer 204 further includes a connection electrode 409. The connection electrode 409 is electrically connected to the first electrode T2s of the second transistor T2 through a via hole 508.

With reference to FIG. 4A, the fifth conductive layer 205 includes a data line 610 extended in the second direction D2. The data line 610 is electrically connected to the connection electrode 409 through a via hole 601 and thus connected to the first electrode T2s of the second transistor T2.

For example, the fifth conductive layer 205 includes a plurality of data lines 610 extended in the second direction D2. For example, the plurality of data lines 610 are electrically connected to a plurality of columns of sub-pixels in one to one correspondence to provide data signals Vd. Each data line 610 is electrically connected to the first electrode T2s of the second transistor T2 in the corresponding column of sub-pixels to provide the data signal Vd.

For example, with reference to FIG. 4A to FIG. 4B and FIG. 8A to FIG. 8B, the fifth conductive layer 205 further includes a connection electrode 620. The connection electrode 620 is electrically connected to the connection electrode 404 through a via hole 602 to electrically connect the connection electrode 404 with the first electrode 134 of the light emitting element 120.

With the connection electrodes 620 and 404 as transfer electrodes, the first electrode of the transistor below is led out to be electrically connected to the light emitting element above. Such a setting may avoid poor connection, line breakage or unevenness resulting from an excessive filling depth of a conductive material due to a via hole directly penetrating in the direction perpendicular to the base substrate. With the transfer electrodes, the depth of the via hole is reduced and the contact efficiency is improved.

With reference to FIG. 4B, the sixth conductive layer 206 includes the first electrode 134 of the light emitting element 120.

For example, with reference to FIG. 4B, the display substrate 20 may further include a pixel defining layer 308 located on the first electrode of the light emitting element. An opening is formed in the pixel defining layer 308 to expose at least a portion of a pixel electrode 134, thus defining an opening region (i.e., an effective light emitting region) 600 of each sub-pixel of the display substrate. A light emitting layer 136 of the light emitting element 120 is formed at least in the opening region (the light emitting layer 136 may also cover a surface of a side, far away from the first electrode of the light emitting element, of part of the pixel defining layer), and a second electrode 135 is formed on the light emitting layer 136, thus forming the light emitting element 120. For example, the second electrode 135 is a common electrode and is disposed in the display substrate 20 as an entire surface. For example, the pixel electrode 134 is a positive electrode of the light emitting element, and the second electrode 135 is a negative electrode of the light emitting element.

For example, the base substrate 101 may be a rigid substrate, such as a glass substrate and a silicon substrate, and may also be formed from a flexible material with excellent heat resistance and durability, such as polyimide (PI), polycarbonate (PC), polyethylene terephthalate (PET), polyethylene, polyacrylate, polyarylate, polyetherimide, polyethersulfone, polyethylene terephthalate (PET), polyethylene (PE), polypropylene (PP), polysulfone (PSF), polymethyl methacrylate (PMMA), triacetate cellulose (TAC), cycloolefin polymer (COP) and cycloolefin copolymer (COC).

For example, materials of the first semiconductor layer 102 and the second semiconductor layer 107 include but are not limited to Si-based materials (amorphous silicon (a-Si), polycrystalline silicon (p-Si), etc.), metal-oxide semiconductors (IGZO, ZnO, AZO, IZTO, etc.), and organic materials (sexithiophene, polythiophene, etc.).

For example, materials of the first to fifth conductive layers may include: gold (Au), silver (Ag), copper (Cu), aluminum (Al), molybdenum (Mo), magnesium (Mg), tungsten (W) and alloy materials formed by such metals; or conductive metal oxide materials such as indium tin oxide (ITO), indium zinc oxide (IZO), zinc oxide (ZnO) and zinc oxide aluminum (AZO).

For example, the light emitting element 120 is of a top-emitting structure. The first electrode 134 is reflective while the second electrode 135 is transmissive or semi-transmissive. For example, the first electrode 134 is a positive electrode, and the second electrode 135 is a negative electrode. For example, the first electrode 134 is an ITO/Ag/ITO stacked structure. The transparent electrically conductive material ITO is a high-work-function material and may be in direct contact with a light emitting material to increase a hole injection rate. The metal material Ag is conducive to improving the reflectivity of the first electrode. For example, the second electrode layer 135 is made of a low-work-function material, e.g., a semi-transmitting metal or metal alloy material (e.g., an Ag/Mg alloy material), to act as the negative electrode.

For example, the first insulating layer 301, the second insulating layer 302, the third insulating layer 303, the fourth insulating layer 304, the fifth insulating layer 305 and the sixth insulating layer 306 are, e.g., inorganic insulating layers, which, for example, are made of a metal oxynitride insulating material including silicon oxides such as silicon oxide, silicon nitride and silicon oxynitride, silicon nitrides or silicon oxynitrides, or aluminum oxide, titanium nitride, or the like. For example, the seventh insulating layer 307 and the pixel defining layer 308 are each made of an organic insulating material, e.g., an organic insulating material such as polyimide (PI), acrylate, epoxy resin and polymethyl methacrylate (PMMA). For example, the seventh insulating layer 307 is a planarized layer. For example, the seventh insulating layer 307 is made of a photoresist material.

At least one embodiment of the present disclosure further provides a display panel including any display substrate 20 described above. For example, the display panel is an OLED display panel, and correspondingly, the display substrate 20 included therein is an OLED display substrate. The display substrate 20 may include or not include a light emitting element. In other words, the light emitting element may be formed in a panel factory after the display substrate 20 is completed. In the case in which the display substrate 20 itself includes no light emitting element, the display panel provided in the embodiments of the present disclosure further includes a light emitting element in addition to the display substrate 20.

Figure 9:
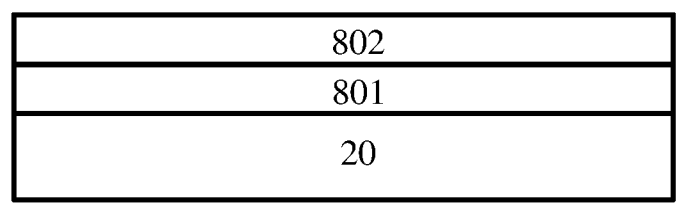
FIG. 9 is a schematic diagram of a display panel provided by at least one embodiment of the present disclosure.

As shown in FIG. 9, for example, the display panel 30 further includes an encapsulation layer 801 and a cover plate 802 that are disposed on the display substrate 20. The encapsulation layer 801 is configured to seal the light emitting element on the display substrate 20 to prevent external moisture and oxygen from infiltration to the light emitting element and a driving sub-circuit to cause damage thereto. For example, the encapsulation layer 801 includes an organic thin film or include a structure of alternately stacked inorganic-organic-inorganic thin films. For example, a water absorbing layer (not shown) may also be disposed between the encapsulation layer 801 and the display substrate 20, which is configured to absorb residual water vapor or sol on the light emitting element resulting from a pre-production process. The cover plate 802 is, for example, a glass cover plate or a flexible cover plate. For example, the cover plate 802 and the encapsulation layer 801 may be of an integrated structure.

Figure 10:
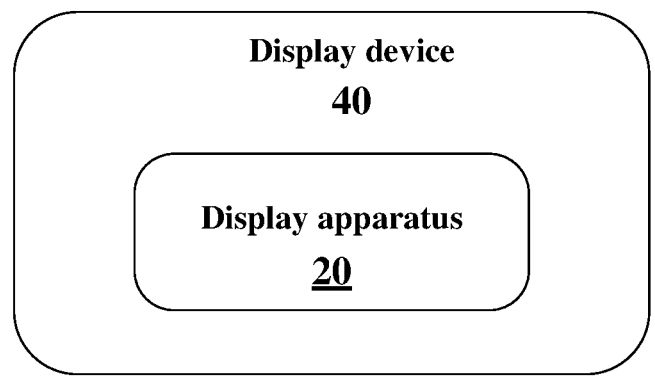
FIG. 10 is a schematic diagram of a display apparatus provided by at least one embodiment of the present disclosure.

At least one embodiment of the present disclosure further provides a display apparatus 40. As shown in FIG. 10, the display apparatus 40 includes any display substrate 20 or display panel 30 described above. The display apparatus 40 provided in this embodiment may be any product or component having the display function, such as a display, an OLED panel, an OLED television, an electronic paper, a mobile phone, a tablet computer, a laptop, a digital photo frame and a navigator.

The foregoing are merely descriptions of the exemplary embodiments of the present disclosure and are not intended to limit the protection scope of the present disclosure. The protection scope of the present disclosure is defined by the appended claims.

What is claimed is:

1. A pixel circuit, comprising:
   a driving sub-circuit, comprising a control terminal connected to a first node, a first terminal connected to a second node, and a second terminal connected to a third node, and configured to control according to a voltage of the control terminal a driving current which flows from the second node to the third node and is used for driving a light emitting element;
   a data writing sub-circuit, connected to the second node and configured to write a data signal to the second node in response to a first scanning signal;
   a first light emitting control sub-circuit, connected to the second node and a first power voltage terminal and configured to write a first power voltage from the first power voltage terminal to the second node in response to a first light emitting control signal;
   a first reset sub-circuit, connected to the first node and configured to write a first reset voltage to the first node in response to a first reset control signal; and
   a bias sub-circuit, connected to the second node and configured to write a reference voltage to the second node in response to a bias control signal to switch on the driving sub-circuit, wherein an absolute value of a voltage difference between the reference voltage and the first reset voltage is a preset value, and
   wherein the preset value is set such that an absolute value of a voltage difference between the control terminal and the first terminal of the driving sub-circuit is less than the preset value when the light emitting element is driven to emit light with a brightness of a highest gray level.

2. The pixel circuit according to claim 1, further comprising a second reset sub-circuit,
   wherein the second reset sub-circuit is connected to a fourth node and configured to be connected to a first electrode of the light emitting element through the fourth node and to write a second reset voltage to the fourth node in response to a second reset control signal.

3. The pixel circuit according to claim 2, wherein the bias control signal and the second reset control signal are a same signal.

4. The pixel circuit according to claim 1, further comprising a second light emitting control sub-circuit,
   wherein the second light emitting control sub-circuit is connected to the third node and a fourth node and configured to be connected to a first electrode of the light emitting element through the fourth node, and
   the second light emitting control sub-circuit is configured to switch on the first node and the fourth node in response to a second light emitting control signal.

5. The pixel circuit according to claim 1, further comprising a compensation sub-circuit,
   wherein the compensation sub-circuit is connected to the first node and the third node and configured to switch on the first node and the third node in response to a second scanning signal to control the driving sub-circuit to write a compensating voltage to the first node based on the data signal written into the second node.

6. The pixel circuit according to claim 1, further comprising a storage sub-circuit,
wherein the storage sub-circuit comprises a first terminal and a second terminal which are connected to the first power voltage terminal and the first node, respectively.

7. The pixel circuit according to claim 1, wherein the bias sub-circuit comprises a bias transistor, and the first reset sub-circuit comprises a reset transistor; and
the bias transistor is a P-type transistor, and the reset transistor is an N-type transistor.

8. A display substrate, comprising:
a base substrate; and
a plurality of sub-pixels distributed in an array on the base substrate in a first direction and a second direction,
wherein at least one of the plurality of sub-pixels comprises a pixel circuit comprising:
a driving sub-circuit, comprising a control terminal connected to a first node, a first terminal connected to a second node, and a second terminal connected to a third node, and configured to control according to a voltage of the control terminal a driving current which flows from the second node to the third node and is used for driving a light emitting element;
a data writing sub-circuit, connected to the second node and configured to write a data signal to the second node in response to a first scanning signal;
a first light emitting control sub-circuit, connected to the second node and a first power voltage terminal and configured to write a first power voltage from the first power voltage terminal to the second node in response to a first light emitting control signal;
a first reset sub-circuit, connected to the first node and configured to write a first reset voltage to the first node in response to a first reset control signal; and
a bias sub-circuit, connected to the second node and configured to write a reference voltage to the second node in response to a bias control signal to switch on the driving sub-circuit,
the display substrate further comprises a bias control line extended in the first direction,
the bias sub-circuit comprises a bias transistor, and
the bias control line is electrically connected to a gate electrode of the bias transistor to provide the bias control signal.

9. The display substrate according to claim 8, further comprising a reference voltage line,
wherein the reference voltage line is electrically connected to a first electrode of the bias transistor to provide the reference voltage, and
wherein the reference voltage line is on a side, away from the base substrate, of the bias control line.

10. The display substrate according to claim 8, further comprising a connection electrode,
wherein a second electrode of the bias transistor is electrically connected to the first terminal of the driving sub-circuit through the connection electrode, and
wherein the connection electrode is on a side, away from the base substrate, of the bias control line.

11. The display substrate according to claim 8, wherein the pixel circuit further comprises a second reset sub-circuit, and the second reset sub-circuit is connected to a fourth node and configured to be connected to a first electrode of the light emitting element through the fourth node and to write a second reset voltage to the fourth node in response to a second reset control signal, and the bias sub-circuit and the second reset sub-circuit are on a same side of the driving sub-circuit in the second direction.

12. The display substrate according to claim 11, wherein the second reset sub-circuit comprises a reset transistor; and
the bias control line is further electrically connected to a gate electrode of the reset transistor to provide the second reset control signal.

13. The display substrate according to claim 8, wherein the first reset sub-circuit and the bias sub-circuit are on two opposite sides of the driving sub-circuit in the second direction.

14. A display substrate, comprising:
a base substrate; and
a plurality of sub-pixels distributed in an array on the base substrate in a first direction and a second direction,
wherein at least one of the plurality of sub-pixels comprises a pixel circuit comprising:
a driving sub-circuit, comprising a control terminal connected to a first node, a first terminal connected to a second node, and a second terminal connected to a third node, and configured to control according to a voltage of the control terminal a driving current which flows from the second node to the third node and is used for driving a light emitting element;
a data writing sub-circuit, connected to the second node and configured to write a data signal to the second node in response to a first scanning signal;
a first light emitting control sub-circuit, connected to the second node and a first power voltage terminal and configured to write a first power voltage from the first power voltage terminal to the second node in response to a first light emitting control signal;
a first reset sub-circuit, connected to the first node and configured to write a first reset voltage to the first node in response to a first reset control signal; and
a bias sub-circuit, connected to the second node and configured to write a reference voltage to the second node in response to a bias control signal to switch on the driving sub-circuit,
the display substrate further comprises a first reset control line extended in the first direction,
wherein the first reset sub-circuit comprises a reset transistor, and the first reset control line is electrically connected to a gate electrode of the reset transistor to provide the first reset control signal.

15. The display substrate according to claim 14, further comprising a first reset voltage line extended in the first direction,
wherein the first reset voltage line is electrically connected to a first electrode of the reset transistor to provide the first reset voltage.

16. The display substrate according to claim 15, wherein, in a direction perpendicular to the base substrate, the first reset voltage line is on a side, close to the base substrate, of an active layer of the reset transistor, and the first reset control line is on a side, away from the base substrate, of the active layer of the reset transistor.

17. A display apparatus, comprising the display substrate according to claim 8.

18. A driving method for the pixel circuit according to claim 1, comprising:
at an initialization phase, switching on the first reset sub-circuit to write the first reset voltage to the first node and switching on the bias sub-circuit to write the reference voltage to the second node to switch on the driving sub-circuit; and at a data writing phase, switching on the data writing sub-circuit to write the data signal to the second node,
wherein the initialization phase is prior to the data writing phase.

* * * * *